United States Patent
Shiga et al.

(10) Patent No.: US 10,128,131 B2
(45) Date of Patent: Nov. 13, 2018

(54) SEALING SHEET WITH SEPARATORS ON BOTH SURFACES, AND METHOD FOR MANUFACTURING SEMICONDUCTOR DEVICE

(71) Applicant: Nitto Denko Corporation, Ibaraki-shi, Osaka (JP)

(72) Inventors: Goji Shiga, Ibaraki (JP); Tsuyoshi Ishizaka, Ibaraki (JP); Kosuke Morita, Ibaraki (JP); Chie Iino, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/037,794

(22) PCT Filed: Oct. 31, 2014

(86) PCT No.: PCT/JP2014/079078
§ 371 (c)(1),
(2) Date: May 19, 2016

(87) PCT Pub. No.: WO2015/076088
PCT Pub. Date: May 28, 2015

(65) Prior Publication Data
US 2016/0300733 A1 Oct. 13, 2016

(30) Foreign Application Priority Data
Nov. 21, 2013 (JP) .................................. 2013-241276

(51) Int. Cl.
*H01L 21/56* (2006.01)
*H01L 23/00* (2006.01)
(Continued)

(52) U.S. Cl.
CPC .............. *H01L 21/568* (2013.01); *C09J 7/10* (2018.01); *C09J 7/40* (2018.01); *H01L 21/56* (2013.01);
(Continued)

(58) Field of Classification Search
CPC ......... H01L 23/29; H01L 21/60; H01L 23/28; H01L 23/31; H01L 21/568;
(Continued)

(56) References Cited

U.S. PATENT DOCUMENTS

2009/0189300 A1* 7/2009 Kawakami ........... C08G 59/621
257/787
2011/0210407 A1* 9/2011 Katayama .......... C08G 73/1046
257/414
(Continued)

FOREIGN PATENT DOCUMENTS

JP 2006 019714 1/2006
JP 2010 109246 5/2010
(Continued)

OTHER PUBLICATIONS

International Preliminary Report on Patentability and Written Opinion of the International Searching Authority, dated Jun. 2, 2016, in International Application No. PCT/JP2014/-79078.
(Continued)

*Primary Examiner* — Kyoung Lee
(74) *Attorney, Agent, or Firm* — Knobbe Martens Olson & Bear, LLP

(57) ABSTRACT

A sealing sheet with separators on both surfaces is provided with a sealing sheet, a separator (A) stacked on one surface of the sealing sheet and having a thickness of 50 μm or more, and a separator (B) stacked on the other surface of the sealing sheet.

4 Claims, 6 Drawing Sheets

(51) Int. Cl.
*H01L 23/31* (2006.01)
*C09J 7/40* (2018.01)
*C09J 7/10* (2018.01)

(52) U.S. Cl.
CPC ........ *H01L 21/561* (2013.01); *H01L 23/3107* (2013.01); *H01L 24/96* (2013.01); *C09J 2201/36* (2013.01); *C09J 2203/326* (2013.01); *H01L 23/3128* (2013.01); *H01L 2224/04105* (2013.01); *H01L 2224/12105* (2013.01); *H01L 2224/131* (2013.01); *H01L 2224/16146* (2013.01); *H01L 2224/17181* (2013.01); *H01L 2224/2919* (2013.01); *H01L 2224/73104* (2013.01); *H01L 2224/73204* (2013.01); *H01L 2224/73259* (2013.01); *H01L 2224/9202* (2013.01); *H01L 2224/94* (2013.01); *H01L 2224/96* (2013.01); *H01L 2224/97* (2013.01); *H01L 2924/181* (2013.01); *H01L 2924/18162* (2013.01); *H01L 2924/3511* (2013.01)

(58) Field of Classification Search
CPC ..... H01L 23/3107; H01L 24/96; H01L 21/56; H01L 21/561; H01L 2924/3511; H01L 2224/73259; H01L 2224/17181; H01L 2224/16146; H01L 2224/97; H01L 2224/94; C09J 7/02; C09J 7/40; C09J 7/00; G06Q 10/1095
See application file for complete search history.

(56) References Cited

U.S. PATENT DOCUMENTS

| | | |
|---|---|---|
| 2012/0052632 A1 | 3/2012 | Sato et al. |
| 2012/0139131 A1 | 6/2012 | Sugo et al. |
| 2012/0156457 A1 | 6/2012 | Kondo |
| 2014/0008821 A1* | 1/2014 | Toyoda ............ H01L 24/97 257/792 |

FOREIGN PATENT DOCUMENTS

| | | | |
|---|---|---|---|
| JP | 2010109246 A * | 5/2010 | ............ H01L 24/97 |
| JP | 2011 032434 | 2/2011 | |
| JP | 2013 038410 | 2/2013 | |
| WO | WO 2010 084939 A1 | 7/2010 | |

OTHER PUBLICATIONS

Japanese Office Action, dated Aug. 22, 2017, in corresponding Japanese patent application No. 2013-241276.
Decision of Refusal received in connection with Japanese Patent Application No. 2013-241276 dated Feb. 6, 2018.
Taiwanese Office Action, dated Mar. 31, 2018, in corresponding Taiwanese Patent Application No. 103139671.
Office Action issued in corresponding Chinese Patent Application No. 201480063321.4 dated Apr. 28, 2018.

* cited by examiner

SEALING SHEET WITH SEPARATORS ON BOTH SURFACES, AND METHOD FOR MANUFACTURING SEMICONDUCTOR DEVICE

TECHNICAL FIELD

The present invention relates to a sealing sheet with separators on both surfaces and a method for manufacturing a semiconductor device.

BACKGROUND ART

As a method for manufacturing a semiconductor device, a method has been conventionally known of sealing one or more semiconductor chips fixed to a substrate, etc. with a sealing resin and dicing the sealed body to form a packaged semiconductor device unit. For example, a sealing sheet constituted with a thermosetting resin has been known as the sealing resin (for example, refer to Patent Document 1).

PRIOR ART DOCUMENT

Patent Document

Patent Document 1: JP-A-2006-19714

DISCLOSURE OF THE INVENTION

Problems to be Solved by the Invention

Both surfaces of the sealing sheet described above are normally covered with separators before use. While being used, the sealing sheet may be pushed up by a suction collet through the separator to be transported. Further, while the sealing sheet is pushed by a suction collet through the separator laminated on one surface, the separator laminated on another surface may be peeled. However, the sealing sheet might fall from the suction collet while being pushed up, transporting, peeling the separator on the other surface, etc.

The present invention has been made in consideration of the above-described problem, and an object thereof is to provide a sealing sheet with separators on both surfaces capable of preventing the sealing sheet from falling from a suction collet when being pushed up by the suction collet, and a method for manufacturing a semiconductor device using the sealing sheet with separators on both surfaces.

Means for Solving the Problem

The present inventors have found that the above-described problem can be solved by adopting the following configuration and completed the present invention.

That is, the present invention is a sealing sheet with separators on both surfaces and characterized to have a sealing sheet, a separator A with a thickness of 50 μm or more laminated on one surface of the sealing sheet, and a separator B laminated on another surface of the sealing sheet.

The present inventors have diligently investigated the causes of the sealing sheet falling from the suction collet. As a result, it has been found that a space is generated between the suction collet and the separator when the separator is warped causing the sealing sheet to fall from the suction collet.

According to the sealing sheet with separators on both surfaces according to the present invention, the separator A with a thickness of 50 μm or more is laminated on one surface of the sealing sheet. The thickness of the separator A is 50 μm or more. The separator A is relatively thick and less subject to warping. Therefore, if the sealing sheet is pushed up by the suction collet through the separator A, the sealing sheet can be prevented from falling from the suction collet.

The present invention is a method for manufacturing a semiconductor device and characterized to have a step A of preparing a laminate in which a semiconductor chip is fixed on a support, a step B of preparing a sealing sheet with separators on both surfaces described above, a step C of pushing up the sealing sheet with separators on both surfaces by a suction collet through the separator A, a step D of peeling the separator B from the sealing sheet with separators on both surfaces to obtain a sealing sheet with a separator on one surface, a step E of arranging the sealing sheet with a separator on one surface on the semiconductor chip of the laminate so that the surface where the separator B of the sealing sheet with a separator on one surface is peeled faces the surface of the semiconductor chip of the laminate, and a step F of embedding the semiconductor chip in the sealing sheet to form a sealed body in which the semiconductor chip is embedded in the sealing sheet.

According to the above-described configuration, the sealing sheet with separators on both surfaces is pushed up by a suction collet through the separator A (Step C). The thickness of the separator A is 50 μm or more. The separator A is relatively thick and less subject to warping. Because the sealing sheet is pushed up by the suction collet through the separator A, the sealing sheet can be prevented from falling from the suction collet.

The sealing sheet with a separator on one surface is arranged on the semiconductor chip of the laminate so that the surface where the separator B of the sealing sheet with a separator on one surface is peeled faces the surface of the semiconductor chip of the laminate (Step E). Then, the semiconductor chip is embedded in the sealing sheet to form a sealed body in which the semiconductor chip is embedded in the sealing sheet (Step F). Accordingly, the sealing sheet is less subject to fall from the suction collet in the step C. Therefore, the sealed body can be effectively manufactured.

The sealing sheet of the sealing sheet with separators on both surfaces is composed of two or more layers, and the thickness of the separator B is preferably less than 40 μm.

When the sealing sheet is composed of two or more layers, the sealing sheet normally has its front side and back side. If the thickness of the separator A is 50 μm or more and the thickness of the separator B is less than 40 μm, it will be easy to determine which side is front or back by using the difference in thickness.

The present invention is a method for manufacturing a semiconductor device and characterized to have a step A of preparing a laminate in which a semiconductor chip is fixed on a support, a step B of preparing a sealing sheet with separators on both surfaces described above, a step C of pushing up the sealing sheet with separators on both surfaces by a suction collet through the separator A, a step D of peeling the separator B from the sealing sheet with separators on both surfaces to obtain a sealing sheet with a separator on one surface, a step E of arranging the sealing sheet with a separator on one surface on the semiconductor chip of the laminate so that the surface where the separator B of the sealing sheet with a separator on one surface is peeled faces the surface of the semiconductor chip of the laminate, and a step F of embedding the semiconductor chip in the sealing sheet to form a sealed body in which the semiconductor chip is embedded in the sealing sheet.

According to the above-described configuration, the sealing sheet with separators on both surfaces is pushed up by a suction collet through the separator A (Step C). The thickness of the separator A is 50 μm or more. The separator A is relatively thick and less subject to warping. Because the sealing sheet is pushed up by the suction collet through the separator A, the sealing sheet can be prevented from falling from the suction collet.

The sealing sheet with a separator on one surface is arranged on the semiconductor chip of the laminate so that the surface where the separator B of the sealing sheet with a separator on one surface is peeled faces the surface of the semiconductor chip of the laminate (Step E). Then, the semiconductor chip is embedded in the sealing sheet to form a sealed body in which the semiconductor chip is embedded in the sealing sheet (Step F). Accordingly, the sealing sheet is less subject to fall from the suction collet in the step C. Therefore, the sealed body can be effectively manufactured.

Because the thickness of the separator B thereof is less than 40 μm while the thickness of the separator A of the sealing sheet with separators on both surfaces is 50 μm or more, it will be easy to determine which side is front or back by using the difference in thickness. As a result, the sealing sheet with separators on both surfaces can be arranged on the semiconductor chip in the step E without mistaking the front side for the back side of the sealing sheet composed of two or more layers. As a result, the yield of the obtained sealed body can be improved.

Effect of the Invention

The present invention can provide a sealing sheet with separators on both surfaces capable of preventing the sealing sheet from falling from a suction collet when being pushed up by the suction collet, and a method for manufacturing a semiconductor device using the sealing sheet with separators on both surfaces.

MODE FOR CARRYING OUT THE INVENTION

Figure 1:
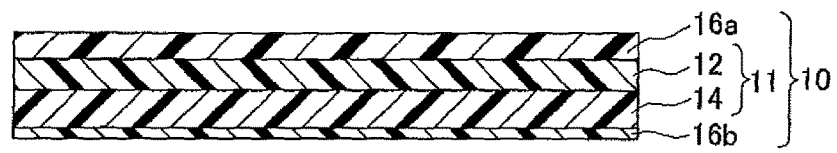
FIG. 1 is a schematic cross section of a sealing sheet with separator on both surfaces according to the present embodiment.

The embodiments of the present invention will be explained below by referring to the drawings. However, the present invention is not limited to only these embodiments.

First, a case will be explained below in which a sealing sheet of the sealing sheet with separators on both surfaces has a two-layered constitution.

(Sealing Sheet with Separators on Both Surfaces)

FIG. 1 is a schematic cross section of a sealing sheet 10 with separators on both surfaces according to the present embodiment. As shown in FIG. 1, the sealing sheet 10 with separators on both surfaces has a sealing sheet 11, a separator 16a having a thickness of 50 μm or more laminated on one surface of the sealing sheet 11, and a separator 16b laminated on another surface of the sealing sheet. The separator 16a corresponds to the separator A of the present invention. The separator 16b corresponds to the separator B of the present invention.

The sealing sheet 11 has a hard layer 12 and a resin layer 14 for embedding. The separator 16a is laminated on the hard layer 12 side of the sealing sheet 11. The separator 16b is laminated on the resin layer 14 for embedding side of the sealing sheet 11.

The thickness of the separator 16a is 50 μm or more, preferably 75 μm or more, and more preferably 100 μm or more. The thickness of the separator 16a is 50 μm or more. The separator 16a is relatively thick and less subject to warping. Therefore, if the sealing sheet 11 is pushed up by the suction collet through the separator 16a, the sealing sheet 11 can be prevented from falling from the suction collet. The larger the thickness of the separator 16a, more preferable the separator 16a is from a viewpoint of the separator 16a being less subject to warping. However, the thickness can be 200 µm or less.

The thickness of the separator 16b is preferably less than 40 µm, more preferably less than 30 µm, and further preferably less than 20 µm. The thickness of the separator 16b can be 10 µm or more for example from a viewpoint of protecting the sealing sheet 11 until the sealing sheet 11 is used. If the thickness of the separator 16a is 50 µm or more and the thickness of the separator 16b is less than 40 µm, it will be easy to determine which side of the sealing sheet 11 is front or back by using the difference in thickness. As a result, mistaking the front side for the back side can be prevented when the sealing sheet is pushed by a suction collet.

An example of the separators 16a and 16b that can be appropriately used is a foliate body including a paper base such as paper; a fiber base such as cloth, unwoven fabric, felt, and a net; a metal base such as a metal foil and a metal plate; a plastic base such as a plastic sheet; a rubber base such as a rubber sheet; a foamed body such as a foamed sheet; and a laminate thereof (particularly, a laminate of a plastic base and other bases, a laminate of plastic sheets, etc.) In the present invention, a plastic base can be suitably used. Examples of a material of the plastic base include an olefin resin such as polyethylene (PE), polypropylene (PP), and an ethylene-propylene copolymer; a copolymer having ethylene as a monomer component such as an ethylene-vinylacetate copolymer (EVA), an ionomer resin, an ethylene-(meth) acrylate copolymer, and an ethylene-(meth)acrylate (random, alternate) copolymer; polyester such as polyethylene terephthalate (PET), polyethylene naphthalate (PEN), and polybutylene terephthalate (PBT); an acrylic resin; polyvinylchloride (PVC); polyurethane; polycarbonate; polyphenylenesulfide (PPS); an amide resin such as polyamide (nylon) and wholly aromatic polyamide (aramide); polyetheretherketone (PEEK); polyimide; polyetherimide; polyvinylidene chloride; ABS (an acrylonitrile-butadiene-styrene copolymer); a cellulose resin; a silicone resin; and a fluororesin. The separator 16a may be a single layer or a multiple layer having two or more layers. The separator 16a can be formed with a conventionally known method.

At least the surfaces of the separators 16a and 16b that contact the sealing sheet 11 are preferably release-treated.

Examples of the releasing agent used in the release treatment include a fluorine releasing agent, a long-chain alkylacrylate releasing agent, and a silicone releasing agent. Among these, a silicone releasing agent is preferable.

The size and shape of the sealing sheet 10 with separators on both surfaces in planar view are not particularly limited; however, a rectangle having a length of each side of 300 mm or more or a rectangle having a length of each side of 500 mm or more is preferred. In addition, the sealing sheet 10 with separators on both surfaces can have a circular shape having a diameter of 200 mm or more. Particularly, when a sealing sheet with separators on both surfaces has a large surface area, warping of the sheet easily occurs. However, even if the sealing sheet 10 with separators on both surfaces according to the present embodiment has a large surface area, warping can be suppressed because the thickness of the separator 16a is 50 µm or more.

(Sealing Sheet)

As described above, the sealing sheet 11 has the hard layer 12 and the resin layer 14 for embedding. The resin layer 14 for embedding is a relatively soft layer and for embedding semiconductor chips in a step F of the method for manufacturing a semiconductor device that will be described later. On the other hand, the hard layer 12 is a relatively hard layer and for maintaining the shape of the entire sealing sheet 11 to be flat.

The minimum melt viscosity at 25° C. to 200° C. of the hard layer 12 is preferably 10,000 Pa·s or more, more preferably 20,000 Pa·s or more, and further preferably 30,000 Pa·s or more. The upper limit value of the minimum melt viscosity at 25° C. to 200° C. of the hard layer 12 is not particularly limited, and the upper limit value is normally 100,000 Pa·s or less or 80,000 Pa·s or less for example. The constituting materials of the hard layer 12 are selected to control the minimum melt viscosity at 25° C. to 200° C. thereof. Especially, when the hard layer 12 contains a thermosetting resin, the thermally cured resin layer may be the hard layer 12.

The minimum melt viscosity at 25° C. to 200° C. of the resin layer 14 for embedding is preferably 50 Pa·s to 9,000 Pa·s, more preferably 60 Pa·s to 8,000 Pa·s, and further preferably 70 Pa·s to 7,000 Pa·s. The constituting materials of the resin layer 14 for embedding are selected to control the minimum melt viscosity at 25° C. to 200° C. thereof.

The minimum melt viscosity at 25° C. to 200° C. of the sealing sheet of the present invention is preferably 50 Pa·s or more. If the minimum melt viscosity at 25° C. to 200° C. of the sealing sheet is 50 Pa·s or more, the separator A is less subject to warping when the sealing sheet is pushed up by a suction collet through the separator A. As a result, generation of the space between the suction collet and the separator A can be suppressed, and the sealing sheet can be further prevented from falling from the suction collet.

The minimum melt viscosity at 25° C. to 200° C. of the sealing sheet of the present invention being 50 Pa·s or more means that the minimum melt viscosity at 25° C. to 200° C. of each layer is 50 Pa·s or more when the sealing sheet consists of a plurality of layers.

In the present embodiment, the minimum melt viscosity at 25° C. to 200° C. of the hard layer 12 and the resin layer 14 for embedding is 50 Pa·s or more. Therefore, generation of the space between the suction collet and the separator A can be suppressed, and the sealing sheet can be further prevented from falling from the suction collet.

(Resin Layer for Embedding)

The constituting materials of the resin layer 14 for embedding are not particularly limited; however, they preferably contain an epoxy resin and a phenol resin as a curing agent. Accordingly, a good thermosetting property can be obtained. The materials are preferably selected so that the minimum melt viscosity at 25° C. to 200° C. is 50 Pa·s to 9.000 Pa·s.

The epoxy resin is not especially limited. For example, various kinds of epoxy resins can be used such as a triphenylmethane-type epoxy resin, a cresol novolac-type epoxy resin, a biphenyl-type epoxy resin, a modified bisphenol A-type epoxy resin, a bisphenol A-type epoxy resin, a bisphenol F-type epoxy resin, a modified bisphenol F-type epoxy resin, a dicyclopentadiene-type epoxy resin, a phenol novolac-type epoxy resin, and a phenoxy resin. These epoxy resins may be used alone or in combination of two or more thereof.

From the viewpoint of securing the toughness of the epoxy resin after curing and the reactivity of the epoxy resin, epoxy resins are preferable which are solid at normal temperature and have an epoxy equivalent of 150 to 200 and a softening point or melting point of 50 to 130° C. Among these epoxy resins, a triphenylmethane-type epoxy resin, a cresol novolac-type epoxy resin, and a biphenyl-type epoxy resin are more preferable from the viewpoint of reliability.

The phenol resin is not especially limited as long as it initiates curing reaction with the epoxy resin. For example, there can be used a phenol novolac resin, a phenolaralkyl resin, a biphenylaralkyl resin, a dicyclopentadiene-type phenol resin, a cresol novolac resin, a resol resin, etc. These phenol resins may be used alone or in combination of two or more thereof.

From the viewpoint of the reactivity with the epoxy resin, phenol resins are preferably used which have a hydroxy group equivalent of 70 to 250 and a softening point of 50 to 110° C. Among these phenol resins, a phenol novolac resin is more preferably used from the viewpoint of its high curing reactivity. Further, phenol resins having low moisture absorbability can be also preferably used such as a phenolaralkyl resin and a bisphenylaralkyl resin from the viewpoint of reliability.

For the compounding ratio of the phenol resin to the epoxy resin, the epoxy resin and the phenol resin are preferably compounded so that the total amount of the hydroxy group in the phenol resin is 0.7 to 1.5 equivalents, and more preferably 0.9 to 1.2 equivalents, to 1 equivalent of the epoxy group in the epoxy resin.

The total content of the epoxy resin and the phenol resin in the resin layer 14 for embedding is preferably 2.5% by weight or more, and more preferably 3.0% by weight or more. If the content is 2.5% by weight or more, good adhering strength to the semiconductor chips 23 and the semiconductor wafer 22 can be obtained. The total content of the epoxy resin and the phenol resin in the resin layer 14 for embedding is preferably 20% by weight or less, and more preferably 10% by weight or less. If the content is 20% by weight or less, moisture absorbability can be decreased.

The resin layer 14 for embedding preferably contains a thermoplastic resin. This makes it possible to provide a handling property when the resin layer 14 for embedding is uncured and low stress property to the cured product.

Examples of the thermoplastic resin include natural rubber, butyl rubber, isoprene rubber, chloroprene rubber, an ethylene-vinylacetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, a fluororesin, and a styrene-isobutylene-styrene block copolymer. These thermoplastic resins may be used alone or in combination of two or more thereof. Among these, a styrene-isobutylene-styrene block copolymer is preferable from the viewpoint of its low stress property and low moisture absorption.

The content of the thermoplastic resin in the resin layer 14 for embedding is preferably 1.5% by weight or more, and more preferably 2.0% by weight. If the content is 1.5% by weight or more, the flexibility can be obtained. The content of the thermoplastic resin in the resin layer 14 for embedding is preferably 6% by weight or less, and more preferably 4% by weight or less. If the content is 4% by weight or less, the adhesion with the semiconductor chips 23 and the semiconductor wafer 22 is good.

The resin layer 14 for embedding preferably contains an inorganic filler.

The inorganic filler is not especially limited, and various kinds of conventionally known fillers can be used. Examples thereof include powers of quartz glass, talc, silica (such as fused silica and crystalline silica), alumina, aluminum nitride, silicon nitride, and boron nitride. These may be used alone or in combination of two or more kinds. Among these, silica and alumina are preferable, and silica is more preferable due to the reason that the linear expansion coefficient can be satisfactorily decreased.

As silica, silica powers are preferable, and fused silica powers are more preferable. Examples of the fused silica powders include spherical fused silica powders and crushed and fused silica powders. However, spherical fused silica powders are preferable from the viewpoint of fluidity. Among these, powers having an average particle size of 10 to 30 μm are preferable, and powders having an average particle size of 15 to 25 μm are more preferable.

The average particle size can be obtained, for example, by measurement on a sample that is extracted arbitrarily from the population using a laser diffraction-scattering type particle size distribution measuring apparatus. Among these, silica powders are preferable having an average particle size of 10 μm to 30 μm, and more preferable having an average particle size of 15 μm to 25 μm.

For example, the average particle size can be measured by using a laser diffraction-scattering type particle size distribution measuring apparatus on a sample that is arbitrarily extracted from the population.

The content of the inorganic filler in the resin layer 14 for embedding is preferably 75% by weight to 95% by weight, and more preferably 78% by weight to 95% by weight relative to the total content of the resin layer 14 for embedding. If the content of the inorganic filler is 75% by weight or more relative to the total content of the resin layer 14 for embedding, the thermal expansion coefficient can be kept low, and thus mechanical damage due to thermal impact can be suppressed. On the other hand, if the content of the inorganic filler is 95% by weight or less relative to the total content of the resin layer 14 for embedding, the flexibility, the fluidity, and the adhesion become more satisfactory.

The resin layer 14 for embedding preferably contains a curing accelerator.

The curing accelerator is not especially limited as long as it promotes curing of the epoxy resin and the phenol resin, and examples of the curing accelerator include organophosphate compounds such as triphenylphosphine and tetraphenylphosphonium tetraphenylborate; and imidazole compounds such as 2-phenyl-4,5-dihydroxymethylimidazole and 2-phenyl-4-methyl-5-hydroxymethylimidazole. Among these, 2-phenyl-4,5-dihydroxymethylimidazole is preferable due to the reason that the curing reaction does not rapidly proceed even when the temperature increases during kneading and the resin layer 14 for embedding can be produced satisfactorily.

The content of the curing accelerator is preferably 0.1 to 5 parts by weight to the total 100 parts by weight of the epoxy resin and the phenol resin.

The resin layer 14 for embedding preferably contains a flame retardant component. This makes it possible to reduce an expansion of combustion when the resin layer 14 for embedding catches fire due to short circuit of the parts or heat generation. Examples of the flame retardant component include various kinds of metal hydroxides such as aluminum hydroxide, magnesium hydroxide, iron hydroxide, calcium hydroxide, tin hydroxide, and composite metal hydroxide; and a phosphazene flame retardant.

From the viewpoint of exhibiting flame retardancy even with a small amount, the content of phosphorus element in the phosphazene flame retardant is preferably 12% by weight or more.

The content of the flame retardant component in the resin layer 14 for embedding is preferably 10% by weight or more, and more preferably 15% by weight or more in the entire organic component (excluding inorganic filler). If the content is 10% by weight or more, the flame retardancy can be obtained satisfactorily. The content of the thermoplastic resin in the resin layer 14 for embedding is preferably 30% by weight or less, and more preferably 25% by weight or less. If the content is 30% by weight or less, deterioration in the physical properties (deterioration in physical properties such as glass transition temperature and resin strength at high temperature) of the cured product tends to be suppressed.

The resin layer 14 for embedding preferably contains a silane coupling agent. The silane coupling agent is not especially limited, and an example includes 3-glycidoxypropyl trimethoxysilane.

The content of the silane coupling agent in the resin layer 14 for embedding is preferably 0.1 to 3% by weight. If the content is 0.1% by weight or more, the strength of the cured product is sufficiently made high, so that the water absorption can be lowered. If the content is 3% by weight or less, the amount of outgas can be decreased.

Other dopants besides each component described above can be appropriately compounded in the resin layer 14 for embedding as necessary. For example, a coloring agent may be compounded as necessary. When the coloring agent is compounded, laser marking can be performed.

(Hard Layer)

The constituting materials of the hard layer 12 can be basically the same as the resin layer 14 for embedding. The materials are preferably selected so that the minimum melt viscosity becomes 10,000 Pa·s or more.

The thickness of the hard layer 12 is not particularly limited; however, the hard layer 12 is preferably thick enough to maintain the surface of the resin of the sealed body formed in the step F described later to be flat. For example, the thickness is preferably 20 µm to 1,000 µm, and more preferably 30 µm to 900 µm.

The thickness of the sealing sheet 11 (the total thickness including the hard layer 12 and the resin layer 14 for embedding) is not particularly limited, and the thickness is 50 µm to 2,000 µm for example from a viewpoint of using the sealing sheet as a sealing sheet.

The method of manufacturing the resin layer 14 for embedding is not especially limited; however, preferred examples are a method of preparing a kneaded product of the resin composition for forming the resin layer 14 for embedding and applying the obtained kneaded product and a method of subjecting the obtained kneaded product to plastic-working to be formed into a sheet shape. This makes it possible to produce the resin layer 14 for embedding without using a solvent. Therefore, the effects on the semiconductor chip 23 from the volatilized solvent can be suppressed.

Specifically, each component described later is melted and kneaded with a known kneader such as a mixing roll, a pressure kneader, or an extruder to prepare a kneaded product, and the obtained kneaded product is applied or plastic-worked into a sheet shape. As a kneading condition, the temperature is preferably the softening point or higher of each component described above, and is for example 30 to 150° C. When the thermal curing property of the epoxy resin is considered, the temperature is preferably 40 to 140° C., and more preferably 60 to 120° C. The time is for example 1 to 30 minutes, and preferably 5 to 15 minutes.

The kneading is preferably performed under a reduced pressure condition (under reduced pressure atmosphere). This makes it possible to remove gas, and to prevent invasion of gas into the kneaded product. The pressure under the reduced pressure condition is preferably 0.1 kg/cm$^2$ or less, and more preferably 0.05 kg/cm$^2$ or less. The lower limit of the pressure under reduced pressure is not especially limited; however, it is 1×10$^{-4}$ kg/cm$^2$ or more.

When the kneaded product is applied to form the resin layer 14 for embedding, the kneaded product after being melt-kneaded is preferably applied while it is at high temperature without being cooled. The application method is not especially limited, and examples thereof include bar coating, knife coating, and slot-die coating. The application temperature is preferably the softening point or higher of each component described above. When the thermal curing property and molding property of the epoxy resin are considered, the temperature is for example 40 to 150° C., preferably 50 to 140° C., and more preferably 70 to 120° C.

When forming the resin layer 14 for embedding by plastic-working the kneaded product, the kneaded product after melt-kneaded is preferably subjected to plastic-working while it is at high temperature without being cooled. The plastic-working process is not especially limited, and examples thereof include flat plate pressing, T-die extrusion, screw-die extrusion, rolling, roll kneading, inflation extrusion, coextrusion, and calendar molding. The temperature for plastic-working is preferably the softening point or higher of each component described above. When the thermal curing property and molding property of the epoxy resin are considered, the temperature is for example 40 to 150° C., preferably 50 to 140° C., and more preferably 70 to 120° C.

The resin, etc. for forming the resin layer 14 for embedding can be dissolved and dispersed into an appropriate solvent to prepare varnish, and the varnish can be applied to obtain the resin layer 14 for embedding.

The method for manufacturing the hard layer 12 is not particularly limited, and the method can be the same as the resin layer 14 for embedding. Especially, when the hard layer 12 contains a thermosetting resin, the resin layer obtained by applying the kneaded product, the resin layer obtained by performing plastic working on the kneaded product, or the resin layer obtained by applying the varnish may be thermally cured to form the hard layer 12. In this case, the resin, etc. for forming the hard layer 12 are preferably prepared so that the tensile storage modulus at 25° C. of the hard layer 12 after thermal curing becomes 2 GPa or more.

The method for manufacturing the sealing sheet 11 is not particularly limited, and for example, the hard layer 12 and the resin layer 14 for embedding are separately formed and these layers are pasted together to obtain the sealing sheet 11. The hard layer 12 may be formed first, and the kneaded product for forming the resin layer 14 for embedding or the varnish may be applied on the hard layer 12 to form the resin layer 14 for embedding.

The method for manufacturing the sealing sheet 10 with separators on both surfaces is not particularly limited, and for example, the separators 16a and 16b are pasted to the sealing sheet 11 to obtain the sealing sheet 10. The hard layer 12 may be pasted onto the separator 16a, the resin layer 14 for embedding may be pasted thereon, and the separator 16b may be pasted thereon. The resin layer 14 for embedding may be pasted onto the separator 16b, the hard layer 12 may be pasted thereon, and the separator 16a may be pasted thereon.

Next, the method for manufacturing a semiconductor device using the sealing sheet 10 with separators on both surfaces will be explained.

First Embodiment

The method for manufacturing a semiconductor device according to the first embodiment has at least a step A of preparing a laminate in which a semiconductor chip is flip-chip bonded to the circuit formation surface of a semiconductor wafer, a step B of preparing the sealing sheet with separators on both surfaces, a step C of pushing up the sealing sheet with separators on both surfaces by a suction collet through the separator A, a step D of peeling the separator B from the sealing sheet with separators on both surfaces to obtain a sealing sheet with a separator on one surface, a step E of arranging the sealing sheet with a separator on one surface on the semiconductor chips of the laminate so that the surface where the separator B of the sealing sheet with a separator on one surface is peeled faces the surface of the semiconductor chips of the laminate, and a step F of embedding the semiconductor chips in the sealing sheet to form a sealed body in which the semiconductor chips are embedded in the sealing sheet.

The case will be explained in the first embodiment in which "the laminate in which the semiconductor chips are fixed on a support" of the present invention is "a laminate in which the semiconductor chips are flip-chip bonded to the circuit formation surface of the semiconductor wafer". The first embodiment is what is called a method for manufacturing a semiconductor device using a chip-on-wafer process.

FIGS. 2 to 12 are schematic cross sections for explaining the method for manufacturing a semiconductor device according to the first embodiment.

[Preparation Step]

In the method for manufacturing a semiconductor device according to the first embodiment, a laminate 20 is first prepared in which a semiconductor chip 23 is flip-chip bonded to a circuit formation surface 22a of a semiconductor wafer 22 (Step A). In the first embodiment, the semiconductor wafer 22 corresponds to "the support" of the present invention. For example, the laminate 20 can be obtained as below.

Figure 2:
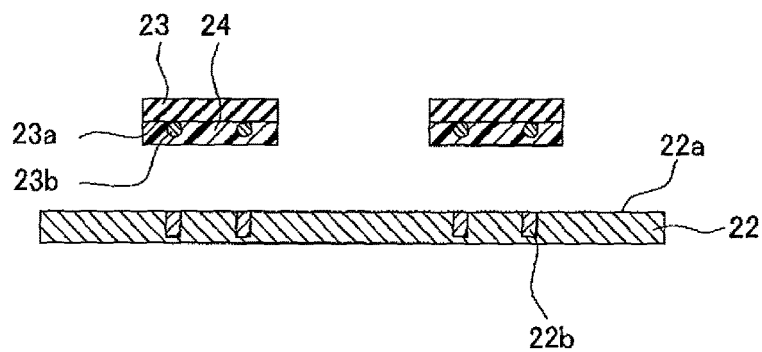
FIG. 2 is a schematic cross section for explaining a method for manufacturing a semiconductor device according to the first embodiment.

As shown in FIG. 2, one or a plurality of semiconductor chips 23 each having a circuit formation surface 23a and the semiconductor wafer 22 having the circuit formation surface 22a are prepared. The case will be explained below in which a plurality of semiconductor chips is flip-chip bonded to a semiconductor wafer. The shape and the size of the semiconductor wafer 22 in planar view can be same as the size and the shape of the sealing sheet 10 with separators on both surfaces in planar view. For example, the size and the shape can be a circular shape having a diameter of 200 mm or more.

Figure 3:
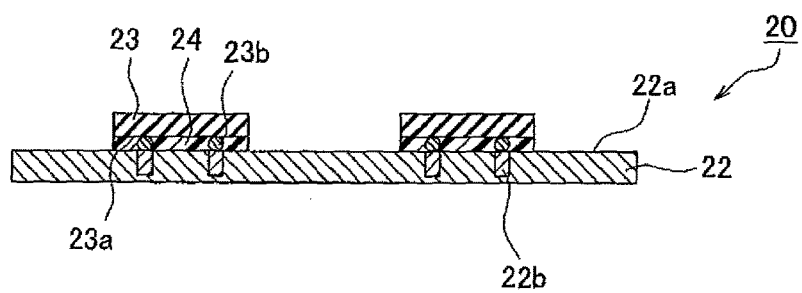
FIG. 3 is a schematic cross section for explaining a method for manufacturing a semiconductor device according to the first embodiment.

Next, as illustrated in FIG. 3, the semiconductor chips 23 are flip-chip bonded to the circuit-forming surface 22 a of the semiconductor wafer 22. For the mounting of the semiconductor chips 23 onto the semiconductor wafer 22, a known apparatus is usable, which is, for example, a flip-chip bonder or a die bonder. Specifically, bumps 23b formed in the circuit-forming surface 23a of each of the semiconductor chips 23 are electrically connected to electrodes 22b formed in the circuit-forming surface 22a of the semiconductor wafer 22. This manner makes it possible to yield a laminate 20 in which the semiconductor chips 23 are mounted on the semiconductor wafer 22. At this time, a resin sheet 24 for underfill may be bonded to the circuit-forming surface 23a of each of the semiconductor chips 23. In this case, by flip-chip bonding the semiconductor chips 23 onto c, gaps between the semiconductor chips 23 and the semiconductor wafer 22 can be sealed up with the resin. A method for flip-chip bonding the semiconductor chips 23, to which the resin sheets 24 for underfill are bonded, onto the semiconductor wafer 22 is disclosed in, for example, JP-A-2013-115186; thus, detailed description thereabout is omitted herein.

[Step of Preparing Sealing Sheet with Separators on Both Surfaces]

In the method for manufacturing a semiconductor device according to the present embodiment, the sealing sheet 10 with separators on both surfaces (refer to FIG. 1) is prepared (Step B).

[Step of Pushing Up Sealing Sheet with Separators on Both Surfaces]

Figure 4:
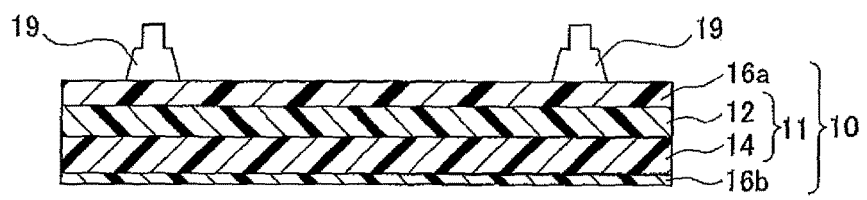
FIG. 4 is a schematic cross section for explaining a method for manufacturing a semiconductor device according to the first embodiment.

After the step B, the sealing sheet 10 with separators on both surfaces is pushed up by a suction collet 19 through the separator 16a as shown in FIG. 4 (Step C). The peel strength at each of the interfaces between the separator 16a of the sealing sheet 10 with separators on both surfaces and the sealing sheet 11 and between the sealing sheet 11 and the separator 16b thereof is sufficient enough to prevent the separators 16a and 16b from falling from the sealing sheet 11 by their own weights.

In the present embodiment, the thickness of the separator 16a is 50 μm or more. The separator 16a is relatively thick and less subject to warping. Therefore, generation of the space between the suction collet 19 and the separator 16a caused by warping of the separator 16a can be suppressed. As a result, the sealing sheet 10 with separators on both surfaces can be prevented from falling from the suction collet 19.

In the present embodiment, because the thickness of the separator 16b is less than 40 μm while the thickness of the separator 16a is 50 μm or more, it will be easy to determine which side is front or back by using the difference in thickness. Because it is easy to determine which side is front or back of the sealing sheet 10 with separators on both surfaces, the sealing sheet 10 with separators on both surfaces can be pushed up by the suction collet 19 through the separator 16 a instead of the separator 16b. As a result, the semiconductor chip 23 can be reliably embedded from the resin layer 14 for embedding side, not the hard layer 12 side, and the yield of the obtained sealed body can be improved. Further, in the present embodiment, the hard layer 12 is a relatively hard layer. Therefore, the semiconductor chip 23 cannot be suitably embedded therein. Accordingly, if the front side is mistakenly determined for the back side of the sealing sheet 10 with separators on both surfaces, the yield of the obtained sealed body decreases.

[Step of Peeling Separator B from Sealing Sheet with Separators on Both Surfaces]

Figure 5:
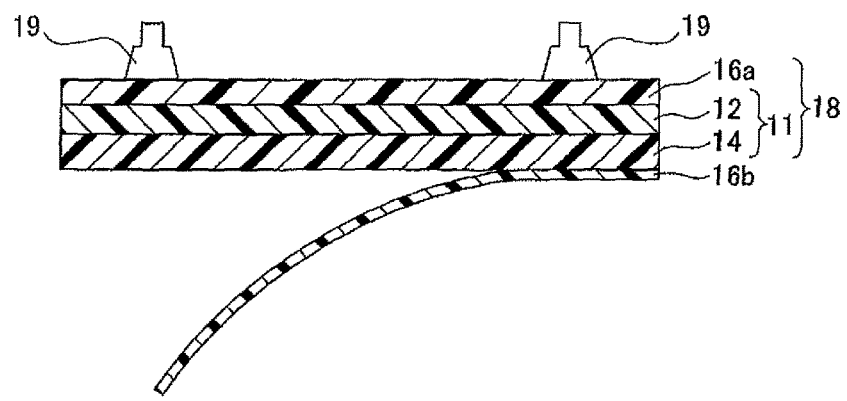
FIG. 5 is a schematic cross section for explaining a method for manufacturing a semiconductor device according to the first embodiment.

As shown in FIG. 5, the separator 16b is peeled from the sealing sheet 10 with separators on both surfaces after the step C to obtain the sealing sheet 18 with a separator on one surface (Step D). The peel strength at the interfaces between the separator 16a of the sealing sheet 10 with separators on both surfaces and the sealing sheet 11 is sufficient enough to prevent the separator 16b from falling.

In the present embodiment, the thickness of the separator 16a is 50 μm or more as described above. The separator 16a is relatively thick and less subject to warping. Therefore, generation of the space between the suction collet 19 and the separator 16a caused by warping of the separator 16a can be suppressed when the separator 16b is peeled. As a result, the sealing sheet 10 with separators on both surfaces can be prevented from falling from the suction collet 19.

[Step of Arranging Sealing Sheet with Separators on One Surface on Laminate]

Figure 6:
FIG. 6 is a schematic cross section for explaining a method for manufacturing a semiconductor device according to the first embodiment.
Figure 6:
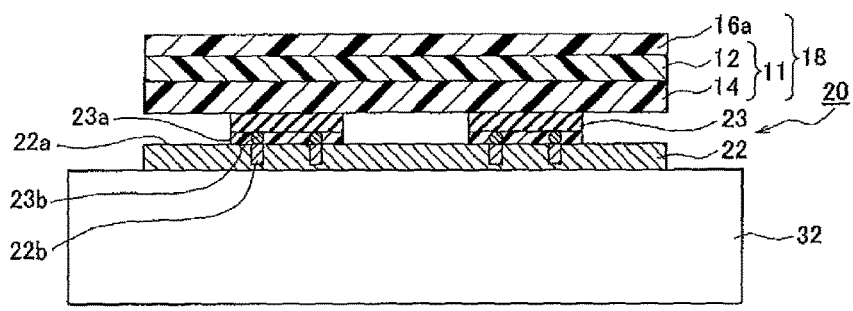

Next, the laminate 20 is arranged on a lower heating plate 32 with the surface where the semiconductor chip 23 is mounted facing upwards, and the sealing sheet 18 with a separator on one surface is arranged on the semiconductor chip 23 of the laminate 20 so that the surface where the separator 16b of the sealing sheet 18 with a separator on one surface is peeled faces the surface of the semiconductor chip 23 of the laminate 20 as shown in FIG. 6 (Step E).

As shown in FIG. 6, the sealing sheet 11 is arranged so that the surface opposite the surface facing the semiconductor wafer 22 becomes the hard layer 12. In this step, the laminate 20 may be arranged on the lower heating plate 32 first, and the sealing sheet 18 with a separator on one surface may be arranged on the laminate 20; or the sealing sheet 18 with separators on one surface may be laminated on the laminate 20 first, and the laminated product in which the sealing sheet 18 with separators on one surface is laminated on the laminate 20 may be arranged on the lower heating plate 32.

[Step of Forming Sealed Body]

Figure 7:
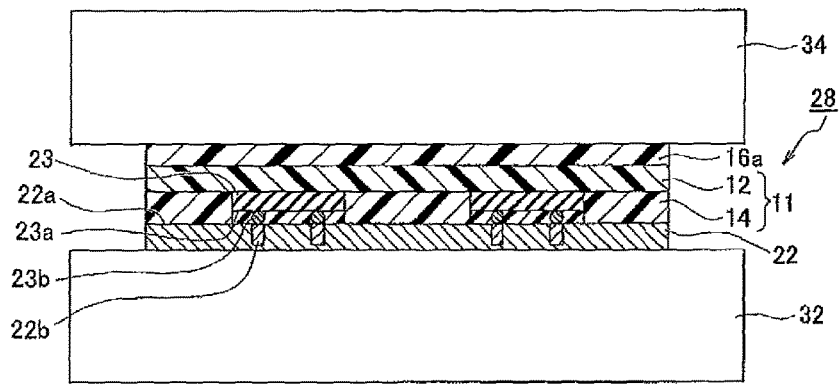
FIG. 7 is a schematic cross section for explaining a method for manufacturing a semiconductor device according to the first embodiment.

Next, the semiconductor chip 23 is embedded in the resin layer 14 for embedding of the sealing sheet 11 by heat pressing with the lower heating plate 32 and an upper heating plate 34 to form a sealed body 28 in which the semiconductor chip 23 is embedded in the sealing sheet 11 as shown in FIG. 7 (Step F). As the sealing sheet 11 is pushed onto the semiconductor chip 23 from the resin layer 14 for embedding side, the hard layer 12 contacts a backside 23c of the semiconductor chip 23. If the minimum melt viscosity at 25° C. to 200° C. of the hard layer 12 is 10,000 Pa·s or more, the embedding of the semiconductor chip 23 in the sealing sheet 11 finishes in the state of the hard layer 12 contacting the backside 23c of the semiconductor chip 23 because the hard layer 12 is relatively hard. Accordingly, the sealed body 28 assumes a state in which the semiconductor chip 23 is sandwiched by the semiconductor wafer 22 and the hard layer 12. Because the semiconductor chip 23 being relatively hard is interposed with a contact between the semiconductor wafer 22 and the hard layer 12 even if the semiconductor chip 23 is held from the semiconductor wafer 22 side and the hard layer 12 side with large force, the distance between the semiconductor wafer 22 and the hard layer 12 does not change. If the minimum melt viscosity at 25° C. to 200° C. of the hard layer 12 is 10,000 Pa·s or more, the shape of the sheet is maintained flat because the hard layer 12 is relatively hard. As a result, the surface of resin after sealing can be made flat. The resin layer 14 for embedding functions as a sealing resin for protecting the semiconductor chip 23 and other associated components from the external environment. Accordingly, the sealed body 28 can be obtained in which the semiconductor chip 23 mounted on the semiconductor wafer 22 is embedded in the c with the resin layer 14 for embedding.

For the hot pressing condition when the semiconductor chip 23 is embedded into the sealing sheet 11, the temperature is for example 40 to 100° C., and preferably 50 to 90° C.; the pressure is for example 0.1 to 10 MPa, and preferably 0.5 to 0.8 MPa; and the duration is for example 0.3 to 10 minutes, and preferably 0.5 to 5 minutes. This makes it possible to provide a semiconductor device in which the semiconductor chip 23 is embedded in the sealing sheet 11. In consideration of improvement of the tackiness and followability of the sealing sheet 11 to the semiconductor chip 23 and the semiconductor wafer 22, pressing is preferably performed under a reduced pressure condition.

For the reduced pressure condition, the pressure is for example 0.1 to 5 kPa, and preferably 0.1 to 100 Pa; and the reduced pressure maintaining time (time from start of reducing pressure to start of pressing) is for example 5 to 600 seconds, and preferably 10 to 300 seconds.

[Step of Peeling Release Liner]

Figure 8:
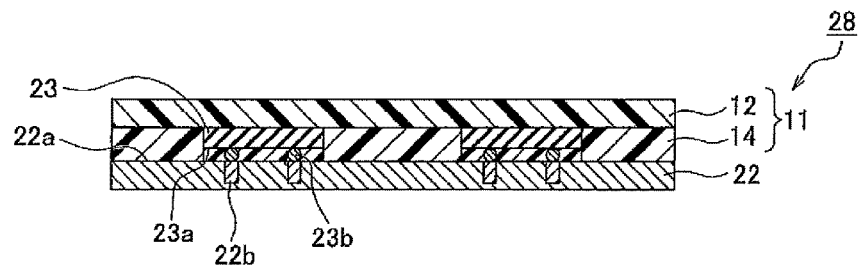
FIG. 8 is a schematic cross section for explaining a method for manufacturing a semiconductor device according to the first embodiment.

Next, the separator 16a is peeled (refer to FIG. 8).

[Thermal Curing Step]

Next, the sealing sheet 11 is thermally cured. Particularly, the resin layer 14 for embedding constituting the sealing sheet 11 is thermally cured. Specifically, for example, the entire sealed body 28 is heated in which the semiconductor chip 23 mounted on the semiconductor wafer 22 is embedded in the sealing sheet 11.

The heating temperature of the thermal curing treatment is preferably 100° C. or more and more preferably 120° C. or more. On the other hand, the upper limit of the heating temperature is preferably 200° C. or less and more preferably 180° C. or less. The heating time is preferably 10 minutes or more and more preferably 30 minutes or more. On the other hand, the upper limit of the heating time is preferably 180 minutes or less and more preferably 120 minutes or less. A pressure is preferably applied in the thermal curing treatment. The pressure is preferably 0.1 MPa or more and more preferably 0.5 MPa or more. On the other hand, the upper limit thereof is preferably 10 MPa or less and more preferably 5 MPa or less.

[Step of Grinding Sheet for Sealing]

Figure 9:
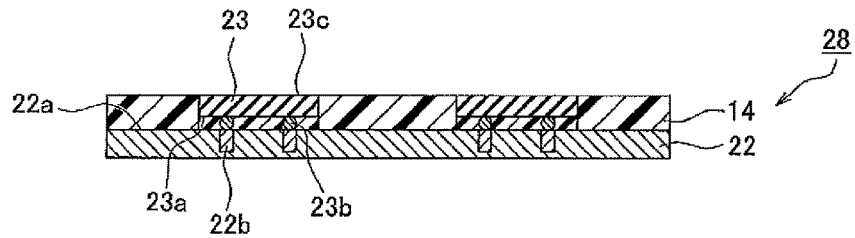
FIG. 9 is a schematic cross section for explaining a method for manufacturing a semiconductor device according to the first embodiment.
Figure 10:
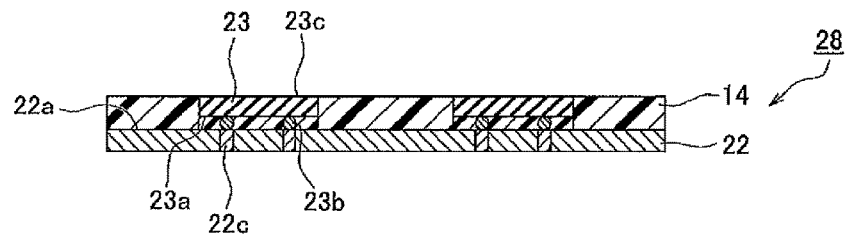
FIG. 10 is a schematic cross section for explaining a method for manufacturing a semiconductor device according to the first embodiment.

Next, as illustrated in FIG. 9, the sealing sheet 11 of the sealed body 28 is ground to expose respective rear surfaces 23c of the semiconductor chips 23. The method for grinding the sealing sheet 11 is not particularly limited, and may be, for example, a grinding method using a grinding stone rotatable at a high velocity.

[Step of Forming Interconnect Layer]

Figure 11:
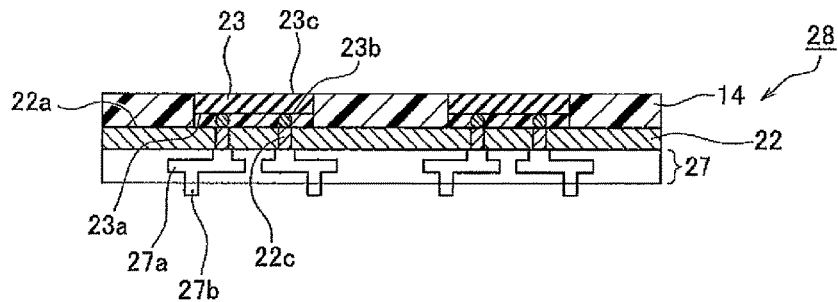
FIG. 11 is a schematic cross section for explaining a method for manufacturing a semiconductor device according to the first embodiment.

Next, the semiconductor wafer surface opposite to the semiconductor-chip-23-mounted surface of the semiconductor wafer 22 is ground to make vias 22c (see FIG. 10), and then an interconnect layer 27 is formed which has interconnects 27a (see FIG. 11). The method for grinding the semiconductor wafer 22 is not particularly limited, and is, for example, a grinding method using a grinding stone rotatable at a high velocity. Bumps 27b projected from the interconnects 27a may be formed in the interconnect layer 27. It is allowable to apply, to the method of forming the interconnect layer 27, a technique known in the prior art for manufacturing a circuit board or interposer, such as a semi-additive method or a subtractive method. Thus, detailed description thereabout is omitted herein.

[Dicing Step]

Figure 12:
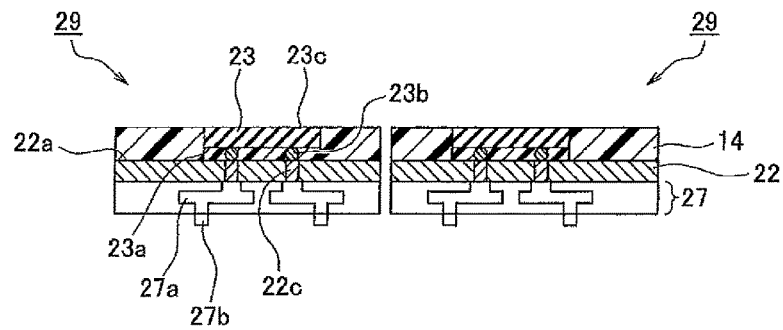
FIG. 12 is a schematic cross section for explaining a method for manufacturing a semiconductor device according to the first embodiment.

Subsequently, as illustrated in FIG. 12, the sealed body 28 from which the rear surfaces 23c of the semiconductor chips 23 are exposed are diced. Through this step, semiconductor devices 29, which correspond to the respective units of the semiconductor chips 23, can be obtained.

[Substrate Mounting Step]

As required, a substrate mounting step may be performed in which each of the semiconductor devices 29 is mounted onto a different substrate (not illustrated). For the mounting of the semiconductor device 29 onto the different substrate, a known apparatus such as a flip-chip bonder or die bonder is usable.

According to the method for manufacturing a semiconductor device according to the first embodiment, the sealing sheet 10 with separators on both surfaces is pushed up by the suction collet 19 through the separator 16 (Step C). The separator 16a has a thickness of 50 μm or more, is relatively thick and less subject to warping. Because the sealing sheet 11 is pushed up by the suction collet 19 through the separator 16a, the sealing sheet 11 can be prevented from falling from the suction collet 19.

Further, the sealing sheet 18 with a separator on one surface is arranged on the semiconductor chip 23 of the laminate 20 so that the surface where the separator 16b of the sealing sheet 18 with a separator on one surface is peeled faces the surface of the semiconductor chip 23 of the laminate 20 (Step E). Then, the semiconductor chip 23 is embedded in the sealing sheet 11 to form the sealed body 28 in which the semiconductor chip 23 is embedded in the sealing sheet 11 (Step F). As describe above, the sealing sheet 11 is less subject to fall from the suction collet 19 in the step C. Therefore, the sealed body 28 can be effectively manufactured.

Because the thickness of the separator 16b is less than 40 μm while the thickness of the separator 16a is 50 μm or more in the sealing sheet 11 with separators on both surfaces, it will be easy to determine which side is front or back by using the difference in thickness. As a result, the sealing sheet 11 can be arranged on the semiconductor chip 23 in the step E without mistaking determining the front side for the back side of the sealing sheet 11 composed of two layers. As a result, the yield of the obtained sealed body 28 can be improved.

The case in which the separator 16b is peeled before the thermal curing step is explained in the first embodiment. However, the separator 16b may be peeled after the thermal curing step.

Second Embodiment

The method for manufacturing a semiconductor device according to the second embodiment has at least a step A of preparing a laminate in which a semiconductor chip is temporarily fixed to a temporary fixing material, a step B of preparing the sealing sheet with separators on both surfaces, a step C of pushing up the sealing sheet with separators on both surfaces by a suction collet through the separator A, a step D of peeling the separator B from the sealing sheet with separators on both surfaces to obtain a sealing sheet with a separator on one surface, a step E of arranging the sealing sheet with a separator on one surface on the semiconductor chips of the laminate so that the surface where the separator B of the sealing sheet with a separator on one surface is peeled faces the surface of the semiconductor chips of the laminate, and a step F of embedding the semiconductor chips in the sealing sheet to form a sealed body in which the semiconductor chips are embedded in the sealing sheet.

The case will be explained in the second embodiment in which "the laminate in which the semiconductor chips are fixed on a support" of the present invention is "a laminate in which the semiconductor chips are temporarily fixed to a temporary fixing material". The second embodiment is what is called a method for manufacturing a semiconductor device referred to as fan-out wafer level packaging (WLP).

FIGS. 13 to 20 are schematic cross sections for explaining the method for manufacturing a semiconductor device according to the second embodiment. The semiconductor chip flip-chip bonded to the semiconductor wafer is resin-sealed with the sealing sheet in the first embodiment. However, the semiconductor chip in the second embodiment is resin-sealed while the semiconductor chip is temporarily fixed on a temporary fixing material, not the semiconductor wafer.

[Step of Preparing Laminate]

Figure 13:
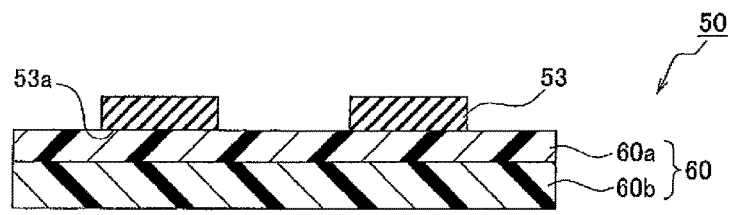
FIG. 13 is a schematic cross section for explaining a method for manufacturing a semiconductor device according to the second embodiment.

In the method for manufacturing a semiconductor device according to the second embodiment, a laminate 50 is first prepared in which a semiconductor chip 53 is temporarily fixed on a temporary fixing material 60 as shown in FIG. 13 (Step A). In the second embodiment, the temporary fixing material 60 corresponds to "the support" of the present invention. For example, the laminate 50 can be obtained as below.

<Step of Preparing Temporary Fixing Material>

In the step of preparing a temporary fixing material, the temporary fixing material 60 is prepared in which a thermally expandable pressure-sensitive adhesive layer 60a is laminated on a supporting base 60b (refer to FIG. 13). A radiation curing type pressure-sensitive adhesive layer can be also used instead of the thermally expandable pressure sensitive adhesive layer. The temporary fixing material 60 with a thermally expandable pressure-sensitive adhesive layer will be explained in the present embodiment.

(Thermally Expandable Pressure-Sensitive Adhesive Layer)

The thermally expandable pressure-sensitive adhesive layer 60 a can be formed with a polymer component and a pressure-sensitive adhesive composition containing a foaming agent. An acrylic polymer (may be referred to as "acrylic polymer A") can be suitably used as the polymer component (especially, as a base polymer). An example of the acrylic polymer A is an acrylic polymer having (meth)acrylic ester as a main monomer component. Examples of (meth)acrylic ester include (meth)acrylic alkyl ester (straight-chain or branched-chain alkyl ester having an alkyl group of 1 to 30 carbon atoms, especially 4 to 18 carbon atoms, such as methyl ester, ethyl ester, propyl ester, isopropyl ester, butyl ester, isobutyl ester, sec-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester) and (meth)acrylic cycloalkyl ester (such as cyclopentyl ester and cyclohexyl ester). These (meth)acrylic esters may be used either alone or in combination of two or more thereof.

The acrylic polymer A may contain a unit corresponding to other monomer components copolymerizable with the (meth)acrylic ester as necessary to modify its cohesive strength, heat resistance, cross-linking properties, etc. Example of these monomer components include a carboxyl group-containing monomer such as acrylic acid, methacrylic acid, itaconic acid, maleic acid, fumaric acid, crotonic acid, and carboxyethylacrylate; an acid anhydride group-containing monomer such as maleic anhydride and itaconic anhydride; a hydroxyl group-containing monomer such as hydroxyethyl (meth)acrylate, hydroxypropyl (math)acrylate, and hydroxybutyl (meth)acrylate; an (N-substituted or unsubstituted) amide-based monomer such as (meth)acrylamide, N,N-dimethyl (meth)acrylamide, N-butyl (meth)acrylamide, N-methylol (meth)acrylamide, and N-methylolpropane (meth)acrylamide; a vinyl ester-based monomer such as vinylacetate and vinylpropionate; a styrene-based monomer such as styrene and α-methylstyrene; a vinylether-based monomer such as vinylmethylether and vinylethylether; a cyanoacrylate-based monomer such as acrylonitrile and methacrylonitrile; an epoxy group-containing acrylic monomer such as glycidyl (meth)acrylate; olefin or a diene-based monomer such as ethylene, propylene, isoprene, butadiene, and isobutylene; a (substituted or unsubstituted) amino group-containing monomer such as aminoethyl (meth)acrylate, N,N-dimethylaminoethyl (meth)acrylate, and t-butylaminoethyl (meth)acrylate; an alkoxyalkyl (meth)acrylate-based monomer such as methoxyethyl(meth) acrylate and ethoxyethyl (meth)acrylate; a monomer having a nitrogen atom-containing ring such as N-vinylpyrrolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine, and N-vinylcaprolactam; N-vinylcarboxamide; a sulfonic acid group-containing monomer such as styrenesulfonic acid, allylsulfonic acid, (meth)acrylamide propanesulfonic acid, and sulfopropyl (meth)acrylate; a phosphate group-containing monomer such as 2-hydroxyethylacryloylphosphate; a maleimide-based monomer such as N-cyclohexylmaleimide, N-isopropylmaleimide, N-laurylmaleimide, and N-phenylmaleimide; an itaconimide-based monomer such as N-methylitaconimide, N-ethylitaconimide, N-butylitaconimide, N-octylitaconimide, N-2-ethylhexylitaconimide, N-cyclohexylitaconimide, and N-laurylitaconimide; a succinimide-based monomer such as N-(meth)acryloyloxymethylene succinimide, N-(meth)acryloyl-6-oxyhexamethylene succinimide, and N-(meth)acryloyl-8-oxyoctamethylene succinimide; a glycol-based acrylic ester monomer such as polyethyleneglycol (meth) acrylate and polypropyleneglycol (meth)acrylate; a monomer having an oxygen atom-containing heterocyclic ring such as tetrahydrofurfuryl (meth)acrylate; an acrylic ester-based monomer containing a fluorine atom such as fluorine-based (meth)acrylate; an acrylic ester-based monomer containing a silicon atom such as silicone-based (meth)acrylate; and a polyfunctional monomer such as hexanediol (meth) acrylate, (poly)ethyleneglycol di(meth)acrylate, (poly) propyleneglycol di(meth)acrylate, neopentylglycol di(meth) acrylate, pentaerythritol di(meth)acrylate, trimethylolpropane tri(meth)acrylate, pentaerythritol tri (meth)acrylate, dipentaerythriol hexa(meth)acrylate, epoxyacrylate, polyesteracrylate, urethaneacrylate, divinylbenzene, butyl di(meth)acrylate, and hexyl di(meth)acrylate.

A single monomer or a mixture of two or more types of monomers is polymerized to obtain the acrylic polymer A. The polymerization can be performed with any of the methods such as solution polymerization (such as radical polymerization, anion polymerization, and cation polymerization), emulsion polymerization, bulk polymerization, suspension polymerization, and photopolymerization (such as ultraviolet (UV) polymerization).

The weight average molecular weight of the acrylic polymer A is not particularly limited; however, the weight average molecular weight is preferably 350,000 to 1,000,000 and more preferably about 450,000 to 800,000.

An external cross-linking agent can be appropriately used in the thermally expandable pressure-sensitive adhesive to adjust its adhesive strength. A specific example of the method of external cross-linking is a method of adding a cross-linking agent such as a polyisocyanate compound, an epoxy compound, an aziridine compound, and a melamine-based cross-linking agent for reaction. When the external cross-linking agent is used, the amount to be used is appropriately determined according to the balance between the agent and the base polymer needed to be cross-linked, and even more, according to the use as a pressure-sensitive adhesive. The amount of the external cross-linking agent used is generally 20 parts by weight or less (preferably, 0.1 parts by weight to 10 parts by weight) relative to 100 parts by weight of the base polymer.

The thermally expandable pressure-sensitive adhesive layer 60a contains a foaming agent so that thermal expansibility can be given to the layer 60a as described above. Therefore, the temporary fixing material 60 is at least partially heated at an arbitrary time while the sealed body 58 is formed on the thermally expandable pressure-sensitive adhesive layer 60a of the temporary fixing material 60 (refer to FIG. 16) to foam and/or expand the foaming agent partially contained in the heated thermally expandable pressure-sensitive adhesive layer 60a. The foaming and/or expansion causes the thermally expandable pressure-sensitive adhesive layer 60a to at least partially expand, which allows the pressure-sensitive adhesive surface (interface between the layer 60a and the sealed body 58) corresponding to the expanding part to deform unevenly, and the adhesion area of the thermally expandable pressure-sensitive adhesive layer 60a to the sealed body 58 decreases. Accordingly, the adhering strength between the thermally expandable pressure-sensitive adhesive layer 60a and the sealed body 58 decreases to peel the sealed body 58 from the temporary fixing material 60 (refer to FIG. 17).

(Foaming Agent)

The foaming agent used in the thermally expandable pressure-sensitive adhesive layer 60a is not particularly limited, and the foaming agent can be appropriately selected from the known foaming agents. The foaming agent may be used either alone or in combination of two or more thereof. Thermally expandable microspheres can be suitably used as the foaming agent.

(Thermally Expandable Microspheres)

The thermally expandable microspheres are not particularly limited, and they can be appropriately selected from the known thermally expandable microspheres (various types of inorganic thermally expandable microspheres, organic thermally expandable microspheres). A microencapsulated foaming agent can be suitably used as the thermally expandable microspheres from viewpoints of easy mixing operation, etc. An example of these thermally expandable microspheres includes microspheres in which a substance that gasifies to expand easily by heating such as isobutane, propane, and pentane is encapsulated in an elastic capsule. The capsule is often formed with a thermally fusible substance or a substance that is destroyed by thermal expansion. Examples of the substance forming the capsule include a vinylidene chloride-acrylonitrile copolymer, polyvinyl alcohol, polybutylbutyral, polymethyl methacrylate, polyacrylonitrile, polyvinylidene chloride, and polysulfone.

The thermally expandable microspheres can be manufactured with a traditional method such as a coacervation method and an interface polymerization method. Examples of the thermally expandable microspheres include commercially available products such as trade name "Matsumoto Microsphere" series (for example, trade names "Matsumoto Microsphere F30", "Matsumoto Microsphere F301D", "Matsumoto Microsphere F50D", "Matsumoto Microsphere F501D", "Matsumoto Microsphere F80SD", "Matsumoto Microsphere F80VSD", etc.) manufactured by Matsumoto Yushi-Seiyaku Co., Ltd.; and trade names "051DU", "053DU", "551DU", "551-20DU", "551-80DU", etc. manufactured by Expancel Inc.

When the thermally expandable microspheres are used as the foaming agent, the particle size (average particle size) of the thermally expandable microspheres can be appropriately selected according to the thickness of the thermally expandable pressure-sensitive adhesive layer. The average particle size of the thermally expandable microspheres can be selected from the range of, for example, 100 μm or less (preferably 80 μm or less, more preferably 1 μm to 50 μm, and especially preferably 1 μm to 30 μm). The particle size of the thermally expandable microspheres may be adjusted in a production process of the thermally expandable microspheres or with a method such as classifying after the production. The particle size of the thermally expandable microsphere is preferably uniform.

(Other Foaming Agents)

In the present embodiment, foaming agents other than the thermally expandable microspheres can be also used. Various types of foaming agents such as various types of inorganic foaming agents and organic foaming agents can be appropriately selected and used as the foaming agent. Typical examples of the inorganic foaming agent include ammonium carbonate, ammonium bicarbonate, sodium bicarbonate, ammonium nitride, sodium borohydride, and various types of azide.

Typical examples of the organic foaming agent include water; a chlorofluoroalkane-based compound such trichloromonofluoromethane and dichloromonofluoromethane; an azo-based compound such as azobisisobutyronitrile, azodicarbonamide, and barium azodicarboxylate; a hydrazine-based compound such as paratoluenesulfonylhydrazide, diphenylsulfone-3,3'-disulfonylhydrazide, 4,4'-oxybis(benzenesulfonylhydrazide), and allylbis(sulfonylhydrazide); a semicarbazide-based compound such as p-toluylenesulfonylsemicarbazide, and 4,4'-oxybis(benzenesulfonylsemicarbazide; a triazole-based compound such as 5-morpholil-1,2,3,4-thiatriazole; and an N-nitriso-based compound such as N,N'-dinitrosopentamethyleneteroramine and N,N'-dimethyl-dinitrosoterephthalamide.

In the present embodiment, a foaming agent is preferable that is strong enough not to rupture until the volume expansion coefficient becomes 5 times or more, preferably 7 times or more, and especially preferably 10 times or more in order to reduce the adhering strength of the thermally expandable pressure-sensitive adhesive layer effectively and stably by the heating treatment.

The compounding amount of the foaming agent (such as thermally expandable microspheres) can be appropriately set according to the thermal expansion ratio, the reducing property of the adhering strength, etc. of the thermally expandable pressure-sensitive adhesive layer; however, the compounding amount is generally 1 part by weight to 150 parts by weight (preferably 10 parts by weight to 130 parts by weight and more preferably 25 parts by weight to 100 parts by weight) relative to 100 parts by weight of the base polymer forming the thermally expandable pressure-sensitive adhesive layer.

In the present embodiment, the foaming agent can be suitably used having the foaming initiation temperature (thermal expansion initiation temperature) ($T_0$) of 80° C. to 210° C., and preferably 90° C. to 200° C. (more preferably 95° C. to 200° C. and especially preferably 100° C. to 170° C.). If the foaming initiation temperature of the foaming agent is lower than 80° C., the foaming agent may be foamed due to heat during the production or use of the sealed body, and the handleability and the productivity deteriorate. On the other hand, when the foaming initiation temperature of the foaming agent exceeds 210° C., excess heat resistance is required in the supporting base of the temporary fixing material and the sealing resin and it is not preferable in terms of the handleability, the productivity, and the cost. The foaming initiation temperature ($T_0$) of the foaming agent corresponds to the foaming initiation temperature ($T_0$) of the thermally expandable pressure-sensitive adhesive layer.

The method for foaming the foaming gent (method for thermally expanding the thermally expandable pressure-sensitive adhesive layer) can be appropriately selected and adopted from the known method of heat foaming.

In the present embodiment, the modulus at 23° C. to 150° C. of the thermally expandable pressure-sensitive adhesive layer without the foaming agent is preferably $5 \times 10^4$ Pa to $1 \times 10^6$ Pa, more preferably $5 \times 10^4$ Pa to $8 \times 10^5$ Pa, and especially preferably $5 \times 10^4$ Pa to $5 \times 10^5$ Pa from a viewpoint of the balance between the moderate adhering strength before the heating treatment and the reducing property of the adhering strength after the heating treatment. If the modulus (temperature: 23° C. to 150° C.) of the thermally expandable pressure-sensitive adhesive layer without the foaming agent is less than $5 \times 10^4$ Pa, the thermally expandability deteriorates, and the peeling property may deteriorate. When the modulus (temperature: 23° C. to 150° C.) of the thermally expandable pressure-sensitive adhesive layer without the foaming agent is larger than $1 \times 10^6$ Pa, the initial adhesion may deteriorate.

The thermally expandable pressure-sensitive adhesive layer without the foaming agent corresponds to the pressure-sensitive adhesive layer formed with a pressure-sensitive adhesive (not containing the foaming agent). Therefore, the modulus of the thermally expandable pressure-sensitive adhesive layer without the foaming agent can be measured using a pressure-sensitive adhesive (not containing the foaming agent). The thermally expandable pressure-sensitive adhesive layer can be formed with a pressure-sensitive adhesive capable of forming a pressure-sensitive adhesive layer having the modulus at 23° C. to 150° C. of $5 \times 10^4$ Pa to $1 \times 10^6$ Pa and a thermally expandable pressure-sensitive adhesive containing the foaming agent.

The thermally expandable pressure-sensitive adhesive layer without the foaming agent added (pressure-sensitive adhesive layer formed with the pressure-sensitive adhesive without the foaming agent) (sample) is produced, and the modulus of the thermally expandable pressure-sensitive adhesive layer without the foaming agent is measured using a dynamic viscoelasticity measurement apparatus "ARES" manufactured by Rheometric Scientific, Inc. under the following conditions: a sample thickness of about 1.5 mm, a parallel plate of φ 7.9 mm, a shear mode, a frequency of 1 Hz, a rising temperature speed of 5° C./min, strain of 0.1% (23° C.) and 0.3% (150° C.). The measured values are a shear storage modulus G' obtained at 23° C. and 150° C.

The types of the base polymer of the pressure-sensitive adhesive, the cross-linking agent, the dopants, etc. can be adjusted to control the modulus of the thermally expandable pressure-sensitive adhesive layer.

The thickness of the thermally expandable pressure-sensitive adhesive layer is not particularly limited, and the thickness can be appropriately selected according to the decreasing property of the adhering strength, etc. For example, the thickness is about 5 μm to 300 μm (preferably 20 μm to 150 μm). However, when the thermally expandable microspheres are used as the foaming agent, the thickness of the thermally expandable pressure-sensitive adhesive layer is preferably larger than the maximum particle size of the thermally expandable microsphere contained. If the thickness of the thermally expandable pressure-sensitive adhesive layer is too small, the surface flatness is lost due to the unevenness of the thermally expandable microspheres, and the adhesion before heating (not foamed) deteriorates. In addition, the degree of deformation of the thermally expandable pressure-sensitive adhesive layer caused by the heating treatment is small, and it becomes difficult for the adhering strength to decrease smoothly. On the other hand, if the thickness of the thermally expandable pressure-sensitive adhesive layer is too large, cohesion failure easily occurs in the thermally expandable pressure-sensitive adhesive layer after the expansion or the foaming due to the heating treatment, and adhesive residue may be generated in the sealed body 58.

The thermally expandable pressure-sensitive adhesive layer may be a single layer or a multiple layer having two or more layers.

In the present embodiment, the thermally expandable pressure-sensitive adhesive layer may contain various kinds of dopants (e.g. colorant, thickener, extender, filler, tackifier, plasticizer, anti-aging agent, antioxidant, surfactant, cross-linking agent, etc.)

(Supporting Base)

The supporting base 60*b* is a thin plate-like member becoming a base material for strength of the temporary fixing material 60. The handleability, heat resistance, etc. may be considered to appropriately select the material of the supporting base 60*b*. Examples thereof include a metal material such as stainless steel (SUS); plastic materials such as polyimide, polyamideimide, polyetheretherketone, and polyethersulfone; glass; and a silicon wafer. Among these, a stainless steel (SUS) plate is preferable from viewpoints of its heat resistance, strength, and recyclability.

The desired strength and the handleability are considered to appropriately select the thickness of the supporting base 60*b*. The thickness is preferably 100 μm to 5,000 μm and more preferably 300 μm to 2,000 μm.

(Method of Forming Temporary Fixing Material)

The thermally expandable pressure-sensitive adhesive layer 60*a* is formed on the supporting base 60*b* to obtain the temporary fixing material 60. For example, a pressure-sensitive adhesive, a foaming agent (such as thermally expandable microspheres), and a solvent, other dopants, etc. as necessary are mixed together to form the thermally expandable pressure-sensitive adhesive layer with a traditional method of forming a mixture into a sheet-like layer. Specific examples for forming the thermally expandable pressure-sensitive adhesive layer include a method of applying a mixture containing a pressure-sensitive adhesive, a foaming agent (such as thermally expandable microspheres), and a solvent and other dopants as necessary onto the supporting base 60*b* and a method of applying the mixture onto an appropriate separator (such as release paper) to form the thermally expandable pressure-sensitive adhesive layer and transferring (transferring and pasting) the layer onto the supporting base 60*b*.

(Method of Thermally Expanding Thermally Expandable Pressure-Sensitive Adhesive Layer)

In the present embodiment, the thermally expandable pressure-sensitive adhesive layer can be thermally expanded by heating. For example, the method of heat treatment can be performed using an appropriate heating means such as a hot plate, a hot air dryer, a near infrared lamp, and an air dryer. The heating temperature during the heat treatment may be the foaming initiation temperature (thermal expansion initiation temperature) or more of the foaming agent (such as thermally expandable microspheres) in the thermally expandable pressure-sensitive adhesive layer, and the conditions of the heat treatment can be appropriately set according to the decreasing property of the adhesion area due to the types of the foaming agent (such as thermally expandable microspheres), the heat resistance of the sealed body containing the supporting base and the semiconductor chip, the heating method (heat capacity, heating means, etc.) The general conditions of the heat treatment are as follows: a temperature of 100° C. to 250° C. for 1 second to 90 seconds (in case of using a hot plate, etc.) or for 5 minutes to 15 minutes (in case of using a hot air dryer, etc.). The heat treatment can be performed in appropriate stages depending on the use. An infrared lamp or heating water may be used as a heat source during the heat treatment.

(Intermediate Layer)

In the present embodiment, an intermediate layer may be provided between the thermally expandable pressure-sensitive adhesive layer 60*a* and the supporting base 60*b* to improve the adhesion, the peeling property after heating, etc. (not shown in the drawings). Among these, a rubbery organic elastic intermediate layer is preferably provided as the intermediate layer. Accordingly, a rubbery organic elastic intermediate layer is provided to obtain a large adhesion area by making the surface of the thermally expandable pressure-sensitive adhesive layer 60*a* follow the shape of the surface of the semiconductor chip 53 well when adhering the semiconductor chip 53 to the temporary fixing material 60 (refer to FIG. 13) and to expand the thermally expandable pressure-sensitive adhesive layer 60*a* uniformly and preferentially in the thickness direction by highly (precisely) controlling the heat expansion of the thermally expandable pressure-sensitive adhesive layer 60*a* when the sealed body 58 is heated and peeled from temporary fixing material 60.

The rubbery organic elastic intermediate layer can be provided on one surface or between the surfaces of the supporting base 60*b*.

For example, the rubbery organic elastic intermediate layer is preferably formed with natural rubber having a D-type shear D-type hardness based on ASTM D-2240 of 50 or less, especially 40 or less, synthetic rubber, or synthetic resin having rubber elasticity. Even if a material is essentially a hard polymer such as polyvinylchloride, dopants such as a plasticizer and a softener can be combined together to exhibit the rubber elasticity. Such compositions can be used as a constituting material of the rubbery organic elastic intermediate layer.

Examples of the method of forming the rubbery organic elastic intermediate layer include a method of coating a base with a coating liquid containing materials for forming a rubbery organic elastic layer such as the natural rubber, the synthetic rubber, and the synthetic resin having rubber elasticity (coating method); a method of adhering a base to a film containing the materials for forming a rubbery organic elastic layer or a laminated film in which a layer including the materials for forming a rubbery organic elastic layer is formed on one or more thermally expandable pressure-sensitive adhesive layers in advance (dry laminating method); and a method of coextruding a resin composition containing a constituting material of the base and a resin composition containing the materials for forming a rubbery organic elastic layer (coextruding method).

The rubbery organic elastic intermediate layer may be formed with a pressure-sensitive adhesive substance having natural rubber, synthetic rubber, or synthetic resin having rubber elasticity as a main component or may be formed with a foaming film, etc. having the main component. The foaming can be performed with a traditional method such as a method of mechanically stirring, a method of using gas produced by reaction, a method of using a foaming agent, a method of removing a soluble substance, a method of spraying, a method of forming syntactic foam, and a sintering method.

The thickness of the intermediate layer such as the rubbery organic elastic intermediate layer is 5 μm to 300 μm for example, and preferably about 20 μm to 150 μm. If, for example, the intermediate layer is a rubbery organic elastic intermediate layer and the thickness of the rubbery organic elastic intermediate layer is too small, a variation in the three-dimensional structure after heat foaming cannot be formed, and the peeling property may deteriorate.

The intermediate layer such as a rubbery organic elastic intermediate layer may be a single layer or a multiple layer having two or more layers.

The intermediate layer may contain various kinds of dopants (e.g. colorant, thickener, extender, filler, tackifier, plasticizer, anti-aging agent, antioxidant, surfactant, cross-linking agent, etc.) within the bounds of not impairing the effect of the temporary fixing material.

<Step of Temporarily Fixing Semiconductor Chip>

In the step of temporarily fixing a semiconductor chip, a plurality of the semiconductor chips 53 is arranged on the temporary fixing material 60 so that the circuit formation surface 53a of each of the semiconductor chips 53 faces the temporary fixing material 60 for temporary fixing (refer to FIG. 13). A known apparatus such as a flip-chip bonder and a die bonder can be used for the temporary fixing of the semiconductor chips 53.

The layout and the number of semiconductor chips 53 that are arranged can be appropriately set according to the shape and size of the temporary fixing material 60, the targeted production number of packages, etc. For example, the semiconductor chips 53 can be arranged in a matrix shape in which the semiconductor chips 53 are aligned in a plurality of rows and a plurality of columns. The size and shape of the temporary fixing material 60 in planar view can be the same as that of the sealing sheet 10 with separators on both surfaces in planar view, and for example, a rectangle having a length of each side of 300 mm or more or a rectangle having a length of each side of 500 mm or more. One example of the step of preparing the laminate has been shown above.

[Step of Preparing Sealing Sheet]

In the method for manufacturing a semiconductor device according to the second embodiment, the sealing sheet 10 with separators on both surfaces (refer to FIG. 1) is prepared (Step B).

[Step of Pushing Up Sealing Sheet with Separators on Both Surfaces]

After the step B, the sealing sheet 10 with separators on both surfaces is pushed up by the suction collet 19 through the separator 16a in the same manner as the first embodiment. (Step C) (refer to FIG. 4).

[Step of Peeling Separator B from Sealing Sheet with Separators on Both Surfaces]

After the step C, the separator 16b is peeled from the sealing sheet 10 with separators on both surfaces to obtain the sealing sheet 18 with a separator on one surface in the same manner as the first embodiment (Step D) (refer to FIG. 5).

[Step of Arranging Sealing Sheet with Separators on One Surface on Laminate]

Figure 14:
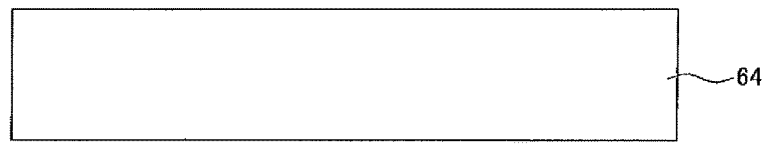
FIG. 14 is a schematic cross section for explaining a method for manufacturing a semiconductor device according to the second embodiment.
Figure 14:
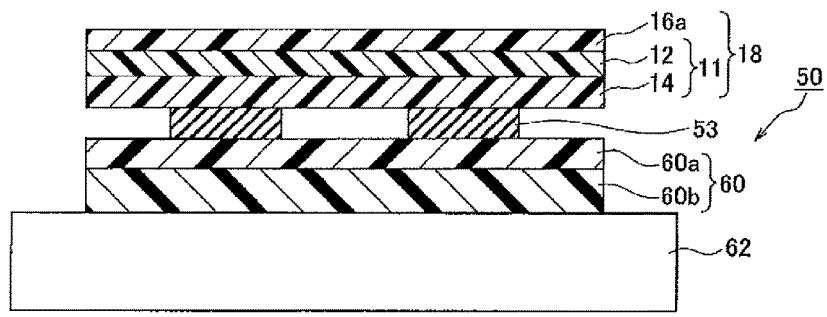

Next, the laminate 50 is arranged on a lower heating plate 62 with the surface where the semiconductor chip 53 is temporarily fixed facing upwards, and the sealing sheet 18 with a separator on one surface is arranged on the semiconductor chip 53 of the laminate 50 so that the surface where the separator 16b of the sealing sheet 18 with a separator on one surface is peeled faces the surface of the semiconductor chip 53 of the laminate 50 as shown in FIG. 14 (Step E).

As shown in FIG. 14, the sealing sheet 11 is arranged so that the surface opposite the surface facing the temporary fixing material 60 becomes the hard layer 12. In this step, the laminate 50 may be arranged on the lower heating plate 62 first, and the sealing sheet 18 with a separator on one surface may be arranged on the laminate 50; or the sealing sheet 18 with separators on one surface may be laminated on the laminate 50 first, and the laminated product in which the sealing sheet 18 with separators on one surface is laminated on the laminate 50 may be arranged on the lower heating plate 62.

[Step of Forming Sealed Body]

Figure 15:
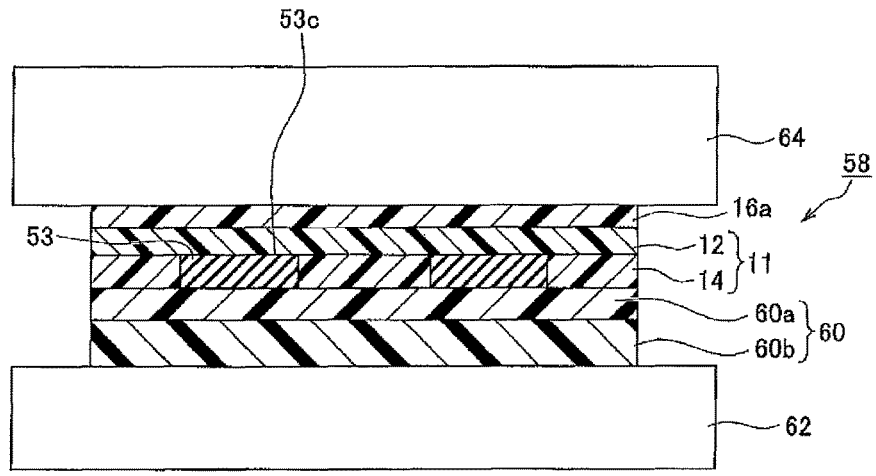
FIG. 15 is a schematic cross section for explaining a method for manufacturing a semiconductor device according to the second embodiment.

Next, the semiconductor chip 53 is embedded in the resin layer 14 for embedding of the sealing sheet 11 by heat pressing with the lower heating plate 62 and upper heating plate 64 to form the sealed body 58 in which the semiconductor chip 53 is embedded in the sealing sheet 11 as shown in FIG. 15 (Step F). As the sealing sheet 11 is pushed in the semiconductor chip 53 from the resin layer 14 for embedding side, the hard layer 12 contacts the backside 53c of the semiconductor chip 53. If the minimum melt viscosity at 25° C. to 200° C. of the hard layer 12 is 10,000 Pa·s or more, the embedding of the sealing sheet 11 in the semiconductor chip 53 finishes in the state of the hard layer 12 contacting the backside 53c of the semiconductor chip 53 because the hard layer 12 is relatively hard. Accordingly, a sealed body 58 becomes a state in which the semiconductor chip 53 is sandwiched with the temporary fixing material 60 and the hard layer 12. Because the semiconductor chip 53 being relatively hard is interposed with a contact between the temporary fixing material 60 and the hard layer 12 even if the semiconductor chip 53 is held from the temporary fixing material 60 side and the hard layer 12 side with large force, the distance between the temporary fixing material 60 and the hard layer 12 does not change. If the minimum melt viscosity at 25° C. to 200° C. of the hard layer 12 is 10,000 Pa·s or more, the shape of the sheet is maintained flat because the hard layer 12 is relatively hard. As a result, the surface of resin after sealing can be made flat. The resin layer 14 for embedding functions as a sealing resin for protecting the semiconductor chip 53 and other associated components from the external environment. Accordingly, the sealed body 58 can be obtained in which the semiconductor chip 53 temporarily fixed on the temporary fixing material 60 is embedded in the sealing sheet 11 with the resin layer 14 for embedding.

The same conditions of heat pressing as those of the first embodiment can be applied when the semiconductor chip 53 is embedded in the sealing sheet 11.

[Step of Peeling Release Liner]

Figure 16:
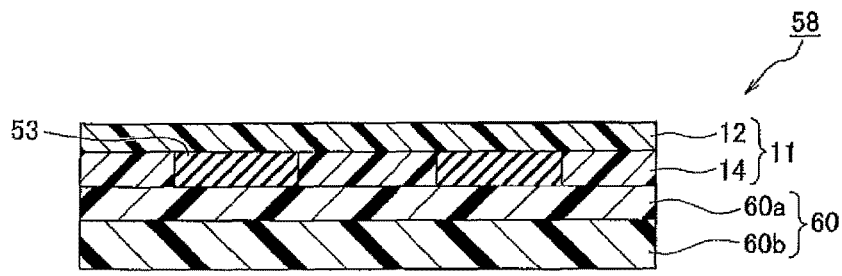
FIG. 16 is a schematic cross section for explaining a method for manufacturing a semiconductor device according to the second embodiment.

Next, the separator 16b is peeled (refer to FIG. 16).

[Thermal Curing Step]

Next, the sealing sheet 11 is thermally cured. Particularly, the resin layer 14 for embedding constituting the sealing sheet 11 is thermally cured. Specifically, for example, the entire sealed body 58 is heated in which the semiconductor chip 53 temporarily fixed on the temporary fixing material 60 is embedded in the sealing sheet 11.

The same conditions of thermal curing treatment as those of the first embodiment can be applied.

[Step of Peeling Thermally Expandable Pressure-Sensitive Adhesive Layer]

Figure 17:
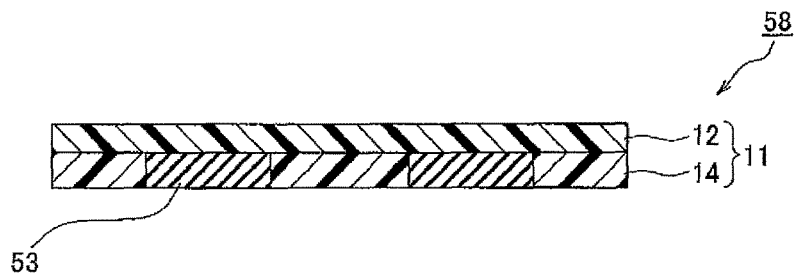
FIG. 17 is a schematic cross section for explaining a method for manufacturing a semiconductor device according to the second embodiment.

Next, the thermally expandable pressure-sensitive adhesive layer 60a is thermally expanded by heating the temporary fixing material 60 to perform peeling between the thermally expandable pressure-sensitive adhesive layer 60a and the sealed body 58 as shown in FIG. 17. A procedure can be also suitably adopted in which the peeling is performed at the interface between the supporting base 60b and the thermally expandable pressure-sensitive adhesive layer 60a, and the peeling by thermal expansion is performed at the interface of the thermally expandable pressure-sensitive adhesive layer 60a and the sealed body 58. In both cases, the thermally expandable pressure-sensitive adhesive layer 60a is heated and thermally expanded to decrease its adhering strength, which makes the peeling at the interface between the thermally expandable pressure-sensitive adhesive layer 60a and the sealed body 58 easy. The conditions described in the section of "Method of thermally expanding thermally expandable pressure-sensitive adhesive layer" can be suitably adopted as the conditions of thermal expansion. Particularly, the thermally expandable pressure-sensitive adhesive layer preferably has a configuration with which the layer is peeled by heating in the step of peeling the thermally expandable pressure-sensitive adhesive layer without being peeled by heating in the thermal curing step.

[Step of Grinding Sealing Sheet]

Figure 18:
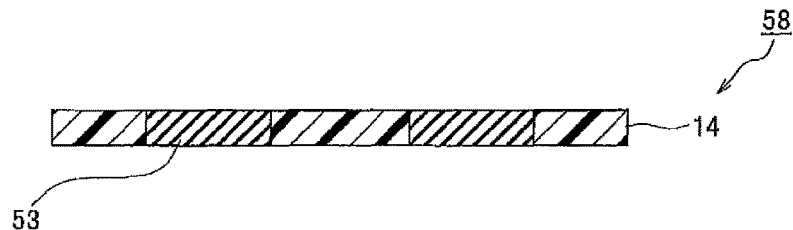
FIG. 18 is a schematic cross section for explaining a method for manufacturing a semiconductor device according to the second embodiment.

Next, the sealing sheet 11 of the sealed body 58 is grinded to expose the backside 53c of the semiconductor chip 53 as shown in FIG. 18. The method of grinding the sealing sheet 11 is not particularly limited, and an example includes a method of grinding the sealing sheet 11 using a grinding wheel rotating at high speed.

(Step of Forming Rewiring)

The present embodiment preferably further includes a step of forming a rewiring for forming a rewiring 69 on the circuit formation surface 53a of the semiconductor chip 53 of the sealed body 58. In the step of forming a rewiring, the thermally expandable pressure-sensitive adhesive layer 60a is peeled to form the rewiring 69 connecting to the exposed semiconductor chip 53 on the sealed body 58 (refer to FIG. 19).

For example, a metal seed layer is formed on the exposed semiconductor chip 53 with the known method such as a vacuum deposition method, and the rewiring 69 can be formed with the known method such as a semiadditive method.

Then, an insulation layer such as polyimide and PBO may be formed on the rewiring 69 and the sealed body 58.

(Step of Forming Bump)

Figure 19:
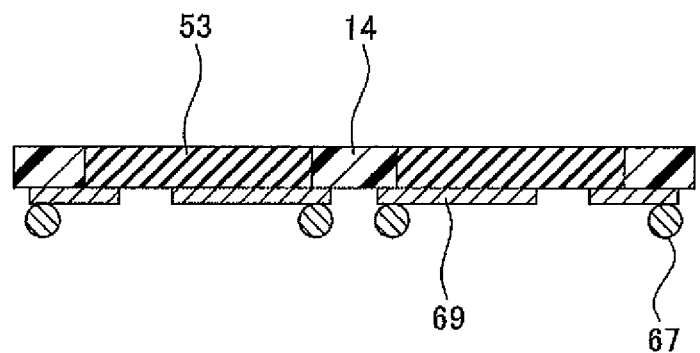
FIG. 19 is a schematic cross section for explaining a method for manufacturing a semiconductor device according to the second embodiment.

Next, a bumping process may be performed to form a bump 67 on the formed rewiring 69 (refer to FIG. 19). The bumping process can be performed with the known method such as solder ball formation and solder plating. The same materials described in the first embodiment are used as the materials of the bump 67.

(Dicing Step)

Figure 20:
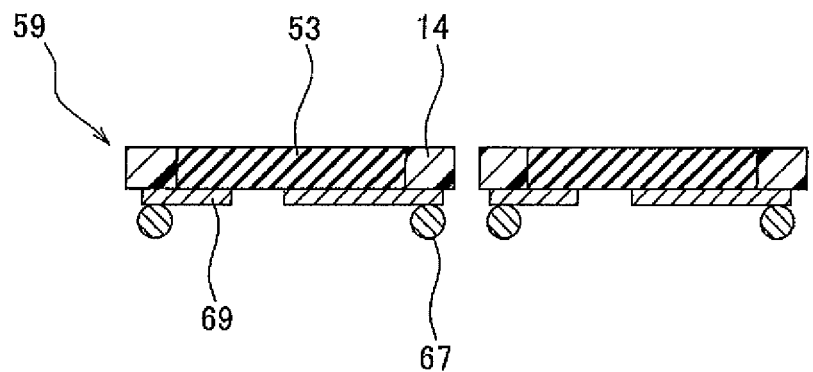
FIG. 20 is a schematic cross section for explaining a method for manufacturing a semiconductor device according to the second embodiment.

Finally, the laminate is diced including the components such as the semiconductor chip 53, the sealing sheet 11, and the rewiring 69 (refer to FIG. 20). Accordingly, a semiconductor device 59 can be obtained in which the wiring is lead out to the outside of the chip region. The same method described in the first embodiment can be adopted as the dicing method. Above, the second embodiment has been explained.

The present invention is not limited to the first embodiment and the second embodiment. Only the step A, the step B, the step C, the step D, the step E, and the step F have to be performed. Other steps are optional, and they may be performed or may not be performed. In addition, each step may be performed in any order to the extent the order is inconsistent with the purpose of the present invention.

A case was explained in the above-described embodiments in which the sealing sheet of the sealing sheet with separators on both surfaces is composed of two layers. However, the layer configuration of the sealing sheet of the present invention is not limited to this example, and the sealing sheet may be composed of three or more layers. Because the thickness of the separator A is 50 µm or more even if the sealing sheet is composed of three or more layers, the sealing sheet is pushed by the suction collet through the separator A to prevent the sealing sheet from falling from the suction collet. In addition, the sealing sheet normally has the front and back sides even if the sealing sheet is composed of three or more layers. Therefore, because the thickness of the separator B is less than 40 µm while the thickness of the separator A is 50 µm or more, it will be easy to determine which side is front or back by using the difference in thickness.

The sealing sheet of the present invention may be composed of one layer. Even if the sealing sheet is composed of one layer, because the thickness of the separator A is 50 µm or more, the sealing sheet is pushed by the suction collet through the separator A to prevent the sealing sheet from falling from the suction collet.

EXAMPLES

The working examples of this invention will be explained in detail below. However, the working examples are not intended to be limited thereto in the scope of this invention. In addition, any of "parts" in each working example is on a weight base unless otherwise specified.

Example 1

<Production of Sealing Sheet>
(Production of Hard Layer)

110 parts of a phenol resin (trade name "MEH-7851-SS" manufactured by Meiwa Plastic Industries, Ltd.), 2,350 parts of a spherical filler (trade name "FB-9454FC" manufactured by Denka Company Limited), 2.5 parts of a silane coupling agent (trade name "KBM-403" manufactured by Shin-Etsu Chemical Co., Ltd.), 13 parts of carbon black (trade name "#20" manufactured by Mitsui Chemicals, Inc.), 3.5 parts of a curing accelerator (trade name "2PHZ-PW" manufactured by Shikoku Chemicals Corporation), and 100 parts of a thermoplastic resin (trade name "SIBSTAR 072T" manufactured by Kaneka Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film (corresponding to the separator A) at 120° C. with a slot die method to produce a sheet of hard layer having a height of 550 mm, a width of 650 mm, and a thickness of 200 µm. A silicone release-treated polyethylene terephthalate film having a thickness of 50 µm was used as the release-treated film.

(Production of Resin Layer for Embedding)

55 parts of a phenol resin (trade name "MEH-7500-35" manufactured by Meiwa Plastic Industries, Ltd.), 1,100 parts of a spherical filler (trade name "FB-9454FC" manufactured by Denka Company Limited), 1 part of a silane coupling agent (trade name "KBM-403" manufactured by Shin-Etsu Chemical Co., Ltd.), 7 parts of carbon black (trade name "#20" manufactured by Mitsui Chemicals, Inc.), and 1.5 parts of a curing accelerator (trade name "2PHZ-PW" manufactured by Shikoku Chemicals Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film (corresponding to the separator B) at 120° C. with a slot die method to produce a sheet of hard layer having a height of 550 mm, a width of 650 mm, and a thickness of 200 μm. A silicone release-treated polyethylene terephthalate film having a thickness of 38 μm was used as the release-treated film.

The hard layer and the resin layer for embedding that were produced were pasted together at 60° C. using a laminator to produce the sealing sheet with separators on both surfaces according to Example 1. In the sealing sheet with separators on both surfaces according to Example 1, the release-treated film (corresponding to the separator A) having a thickness of 50 μm, the hard layer having a thickness of 200 μm, the resin layer for embedding having a thickness of 200 μm, and the release-treated film (corresponding to the separator B) having a thickness of 38 μm were laminated in this order.

Example 2

<Production of Sealing Sheet>
(Production of Hard Layer)
110 parts of a phenol resin (trade name "MEH-7851-SS" manufactured by Meiwa Plastic Industries, Ltd.), 2,350 parts of a spherical filler (trade name "FB-9454FC" manufactured by Denka Company Limited), 2.5 parts of a silane coupling agent (trade name "KBM-403" manufactured by Shin-Etsu Chemical Co., Ltd.), 13 parts of carbon black (trade name "#20" manufactured by Mitsui Chemicals, Inc.), 3.5 parts of a curing accelerator (trade name "2PHZ-PW" manufactured by Shikoku Chemicals Corporation), and 100 parts of a thermoplastic resin (trade name "SIBSTAR072T" manufactured by Kaneka Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film (corresponding to the separator A) at 120° C. with a slot die method to produce a sheet of hard layer having a height of 550 mm, a width of 650 mm, and a thickness of 200 μm. A silicone release-treated polyethylene terephthalate film having a thickness of 75 μm was used as the release-treated film.
(Production of Resin Layer for Embedding)
55 parts of a phenol resin (trade name "MEH-7500-3S" manufactured by Meiwa Plastic Industries, Ltd.), 1,100 parts of a spherical filler (trade name "FB-9454FC" manufactured by Denka Company Limited), 1 part of a silane coupling agent (trade name "KBM-403" manufactured by Shin-Etsu Chemical Co., Ltd.), 7 parts of carbon black (trade name "#20" manufactured by Mitsui Chemicals, Inc.), and 1.5 parts of a curing accelerator (trade name "2PHZ-PW" manufactured by Shikoku Chemicals Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film (corresponding to the separator B) at 120° C. with a slot die method to produce a sheet of hard layer having a height of 550 mm, a width of 650 mm, and a thickness of 200 μm. A silicone release-treated polyethylene terephthalate film having a thickness of 38 μm was used as the release-treated film.

The hard layer and the resin layer for embedding that were produced were pasted together at 60° C. using a laminator to produce the sealing sheet with separators on both surfaces according to Example 2. In the sealing sheet with separators on both surfaces according to Example 2, the release-treated film (corresponding to the separator A) having a thickness of 75 μm, the hard layer having a thickness of 200 μm, the resin layer for embedding having a thickness of 200 μm, and the release-treated film (corresponding to the separator B) having a thickness of 38 μm were laminated in this order.

Example 3

(Production of Sealing Sheet)
55 parts of a phenol resin (trade name "H-4" manufactured by Meiwa Plastic Industries, Ltd.), 500 parts of a spherical filler (trade name "FB-7SDC" manufactured by Denka Company Limited), 1 part of a silane coupling agent (trade name "KBM-403" manufactured by Shin-Etsu Chemical Co., Ltd.), 7 parts of carbon black (trade name "#20" manufactured by Mitsui Chemicals, Inc.), and 1.5 parts of a curing accelerator (trade name "2PHZ-PW" manufactured by Shikoku Chemicals Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film (corresponding to the separator A) at 120° C. with a slot die method to produce a sheet A having a height of 550 mm, a width of 650 mm, and a thickness of 200 μm. A silicone release-treated polyethylene terephthalate film having a thickness of 50 μm was used as the release-treated film.

Further, the obtained kneaded product was applied onto a release-treated film (corresponding to the separator B) at 120° C. with a slot die method to produce a sheet B having a height of 550 mm, a width of 650 mm, and a thickness of 200 μm. A silicone release-treated polyethylene terephthalate film having a thickness of 38 μm was used as the release-treated film.

The sheet A and the sheet B that were produced were pasted together at 60° C. using a laminator to produce the sealing sheet with separators on both surfaces according to Example 3. In the sealing sheet with separators on both surfaces according to Example 3, the release-treated film (corresponding to the separator A) having a thickness of 50 μm, the sealing sheet having a thickness of 400 μm, and the release-treated film (corresponding to the separator B) having a thickness of 38 μm were laminated in this order.

Comparative Example 1

<Production of Sealing Sheet>
(Production of Hard Layer)
110 parts of a phenol resin (trade name "MEH-7851-SS" manufactured by Meiwa Plastic Industries, Ltd.), 2,350 parts of a spherical filler (trade name "FB-9454FC" manufactured by Denka Company Limited), 2.5 parts of a silane coupling agent (trade name "KBM-403" manufactured by Shin-Etsu Chemical Co., Ltd.), 13 parts of carbon black (trade name "#20" manufactured by Mitsui Chemicals, Inc.), 3.5 parts of a curing accelerator (trade name "2PHZ-PW" manufactured by Shikoku Chemicals Corporation), and 100 parts of a thermoplastic resin (trade name "SIBSTAR 072T" manufactured by Kaneka Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film at 120° C. with a slot die method to produce a sheet of hard layer having a height of 550 mm, a width of 650 mm, and a thickness of 200 μm. A silicone release-treated polyethylene terephthalate film having a thickness of 38 μm was used as the release-treated film.

(Production of Resin Layer for Embedding)

55 parts of a phenol resin (trade name "MEH-7500-3S" manufactured by Meiwa Plastic Industries, Ltd.), 1,100 parts of a spherical filler (trade name "FB-9454FC" manufactured by Denka Company Limited), 1 part of a silane coupling agent (trade name "KBM-403" manufactured by Shin-Etsu Chemical Co., Ltd.), 7 parts of carbon black (trade name "#20" manufactured by Mitsui Chemicals, Inc.), and 1.5 parts of a curing accelerator (trade name "2PHZ-PW" manufactured by Shikoku Chemicals Corporation) were compounded in 100 parts of an epoxy resin (trade name "YSLV-80XY" manufactured by Nippon Steel Chemical Co., Ltd.); and the composition was melt-kneaded for 10 minutes in total under a reduced pressure (0.01 kg/cm$^2$) by heating at 60° C. for 2 minutes, 80° C. for 2 minutes, and 120° C. for 6 minutes in this order using a roll kneader to prepare a kneaded product. Then, the obtained kneaded product was applied onto a release-treated film at 120° C. with a slot die method to produce a sheet of hard layer having a height of 550 mm, a width of 650 mm, and a thickness of 200 μm. A silicone release-treated polyethylene terephthalate film having a thickness of 38 μm was used as the release-treated film.

The hard layer and the resin layer for embedding that were produced were pasted together at 60° C. using a laminator to produce the sealing sheet with separators on both surfaces according to Comparative Example 1. In the sealing sheet with separators on both surfaces according to Comparative Example 1, the release-treated film having a thickness of 50 μm, the hard layer having a thickness of 200 μm, the resin layer for embedding having a thickness of 200 μm, and the release-treated film having a thickness of 38 μm were laminated in this order.

(Measurement of Minimum Melt Viscosity)

The minimum melt viscosities of the hard layer and the resin layer for embedding of each of Examples 1 and 2 and Comparative Example 1 were measured using a dynamic viscoelasticity measurement apparatus "ARES" manufactured by Rheometric Scientific, Inc. The minimum melt viscosity of the sealing sheet of Example 3 was also measured. Specifically, the minimum value of the melt viscosity at 25° C. to 200° C. of each sample was made to the minimum melt viscosity. The measurement conditions were as follows: a rising temperature speed of 10° C./min, strain of 20%, a frequency of 0.1 Hz, and a plate diameter of 25 mm. The results are shown in Table 1.

(Evaluation of Handleability)

The sealing sheet with separators on both surfaces of each of Examples 1 and 2 and Comparative Example 1 was pushed up by a suction collet through a release-treated film (separator A) on the hard layer side, and the release-treated film (separator B) on the resin layer for embedding side was peeled. Whether or not the sealing sheet fell during peeling was confirmed. The case in which the sealing sheet did not fall was marked as ○, and the case in which the sealing sheet fell was marked as ×. The results are shown in Table 1.

TABLE 1

|  | Example 1 | Example 2 | Example 3 | Comparative Example 1 |
|---|---|---|---|---|
| Minimum Melt Viscosity [Pa · s] of Hard Layer | 40000 | 40000 | — | 40000 |
| Minimum Melt Viscosity [Pa · s] of Resin Layer for Embedding | 100 | 100 | — | 100 |
| Minimum Melt Viscosity [Pa · s] of Sealing Sheet | — | — | 50 | — |
| Handleability | ○ | ○ | ○ | X |

DESCRIPTION OF REFERENCE SIGNS

10 Sealing Sheet with Separators on Both Surfaces
11 Sealing Sheet
18 Sealing Sheet with Separator on One Surface
16a Separator (Separator A)
16b Separator (Separator B)
20, 50 Laminate
22 Semiconductor Wafer
23, 53 Semiconductor Chip
28, 58 Sealed Body
29, 59 Semiconductor Device
Temporary Fixing Material

The invention claimed is:

1. A laminate of a sealing sheet and separators on both surfaces of the sealing sheet, said laminate comprising:
    a sealing sheet comprising a resin layer and a hard layer,
    a separator A with a thickness of 50 μm or more laminated on one surface of the sealing sheet, and
    a separator B laminated on another surface of the sealing sheet,
    wherein a thickness of the sealing sheet is from 50 μm to 2,000 μm, and a thickness of the hard layer is from 20 μm to 1,000 μm, and
    wherein either separator A or separator B is laminated on and in contact with the hard layer.

2. A method for manufacturing a semiconductor device, comprising:
    a step A of preparing a laminate in which a semiconductor chip is fixed on a support,
    a step B of preparing a sealing sheet with separators on both surfaces according to claim 1,
    a step C of pushing up the sealing sheet with separators on both surfaces by a suction collet through the separator A,
    a step D of peeling the separator B from the sealing sheet with separators on both surfaces to obtain a sealing sheet with a separator on one surface,
    a step E of arranging the sealing sheet with a separator on one surface on the semiconductor chip of the laminate so that the surface where the separator B of the sealing sheet with a separator on one surface is peeled faces the surface of the semiconductor chip of the laminate, and a step F of embedding the semiconductor chip in the sealing sheet to form a sealed body in which the semiconductor chip is embedded in the sealing sheet.

3. The sealing sheet with separators on both surfaces according to claim 1, wherein the sealing sheet is composed of two or more layers, and the thickness of the separator B is less than 40 μm.

4. A method for manufacturing a semiconductor device, comprising:

a step A of preparing a laminate in which a semiconductor chip is fixed on a support, a step B of preparing a sealing sheet with separators on both surfaces according to claim 3, a step C of pushing up the sealing sheet with separators on both surfaces by a suction collet through the separator A, a step D of peeling the separator B from the sealing sheet with separators on both surfaces to obtain a sealing sheet with a separator on one surface, a step E of arranging the sealing sheet with a separator on one surface on the semiconductor chip of the laminate so that the surface where the separator B of the sealing sheet with a separator on one surface is peeled faces the surface of the semiconductor chip of the laminate, and a step F of embedding the semiconductor chip in the sealing sheet to form a sealed body in which the semiconductor chip is embedded in the sealing sheet.

* * * * *

UNITED STATES PATENT AND TRADEMARK OFFICE
CERTIFICATE OF CORRECTION

PATENT NO. : 10,128,131 B2
APPLICATION NO. : 15/037794
DATED : November 13, 2018
INVENTOR(S) : Goji Shiga et al.

Page 1 of 1

It is certified that error appears in the above-identified patent and that said Letters Patent is hereby corrected as shown below:

In the Specification

Column 11, Line 50, change "22 a" to --22a--.

Column 12, Line 37, change "16 a" to --16a--.

Column 16, Line 21, change "60 a" to --60a--.

Column 19, Line 23-24, change "p-toluylenesulfonylsemicarbazide," to --p-toluenesulfonylsemicarbazide,--.

Column 19, Line 26, change "N-nitriso" to --N-nitroso--.

Column 27, Line 33, change ""SIBSTAR072T"" to --"SIBSTAR 072T"--.

Column 30, Line 12 (approx.), change "[Pa · s]" to --$[Pa \cdot s]$--.

Column 30, Line 14 (approx.), change "[Pa · s]" to --$[Pa \cdot s]$--.

Column 30, Line 18 (approx.), change "[Pa · s]" to --$[Pa \cdot s]$--.

Signed and Sealed this
Fifth Day of May, 2020

Andrei Iancu
*Director of the United States Patent and Trademark Office*